(12) United States Patent  
Sugahara et al.

(10) Patent No.: US 7,423,327 B2  
(45) Date of Patent: Sep. 9, 2008

(54) SPIN TRANSISTOR BASED ON THE SPIN-FILTER EFFECT AND A NON-VOLATILE MEMORY USING SPIN TRANSISTORS

(75) Inventors: Satoshi Sugahara, Kanagawa (JP); Masaaki Tanaka, Saitama (JP)

(73) Assignee: Japan Science and Technology Agency, Saitama (JP)

( * ) Notice: Subject to any disclaimer, the term of this patent is extended or adjusted under 35 U.S.C. 154(b) by 67 days.

(21) Appl. No.: 10/522,241

(22) PCT Filed: Jul. 25, 2003

(86) PCT No.: PCT/JP03/09438

§ 371 (c)(1), (2), (4) Date: Oct. 5, 2005

(87) PCT Pub. No.: WO2004/012272

PCT Pub. Date: Feb. 5, 2004

(65) Prior Publication Data

US 2006/0043443 A1 Mar. 2, 2006

(30) Foreign Application Priority Data

Jul. 25, 2002 (JP) ............................. 2002-217336  
Mar. 26, 2003 (JP) ............................. 2003-086145

(51) Int. Cl.  
*H01L 29/02* (2006.01)

(52) U.S. Cl. .................. 257/421; 257/2; 257/3; 257/4; 257/5

(58) Field of Classification Search .................. 257/1–5, 257/295, 421; 438/800; 365/171  
See application file for complete search history.

(56) References Cited

U.S. PATENT DOCUMENTS 5,416,353 A * 5/1995 Kamiguchi et al. .......... 257/421

(Continued)

FOREIGN PATENT DOCUMENTS

EP 1 117 136 A1 3/2000

(Continued)

OTHER PUBLICATIONS

Supriyo Datta et al., "Electric Analog of the Electro-Optic Modulator", Appl. Phys. Lett, vol. 56, No. 7, Feb. 12, 1990, pp. 665-667.

(Continued)

*Primary Examiner*—Jerome Jackson  
*Assistant Examiner*—Jami M Valentine  
(74) *Attorney, Agent, or Firm*—Reed Smith LLP; Stanley P. Fisher, Esq.; Juan Carlos A. Marquez, Esq.

(57) ABSTRACT

A spin transistor comprises a spin injector for injecting, from a first nonmagnetic electrode carriers with a spin parallel to a spin band forming the band edge of a first ferromagnetic barrier layer, to a second nonmagnetic electrode layer, as hot carriers. It also comprises a spin analyzer whereby, due to spin-splitting at the band edge of a second ferromagnetic barrier layer, the spin-polarized hot carriers are transported to a third nonmagnetic electrode when the direction of the spin of the carriers injected into the second nonmagnetic electrode is parallel to that of the spin of the spin band at the band edge of the second ferromagnetic barrier layer, whereas the hot carriers are not transported to the third nonmagnetic electrode in the case of antiparallel spin. A memory element is also provided that comprises such a spin transistor.

19 Claims, 14 Drawing Sheets

U.S. PATENT DOCUMENTS

| | | | |
|---|---|---|---|
| 5,565,695 | A | 10/1996 | Johnson |
| 5,652,445 | A | 7/1997 | Johnson |
| 5,747,859 | A | 5/1998 | Mizushima et al. |
| 5,877,511 | A | 3/1999 | Tanamoto et al. |
| 5,962,905 | A | 10/1999 | Kamiguchi et al. |
| 6,069,820 | A | 5/2000 | Inomata et al. |
| 6,169,688 | B1 * | 1/2001 | Noguchi ............... 365/171 |
| 6,297,987 | B1 | 10/2001 | Johnson et al. |
| 6,381,171 | B1 | 4/2002 | Inomata et al. |
| 6,403,999 | B1 * | 6/2002 | O'Handley et al. ......... 257/295 |
| 2001/0031547 | A1 | 10/2001 | Ohno et al. |
| 2002/0064004 | A1 | 5/2002 | Worledge |
| 2002/0096698 | A1 * | 7/2002 | Flatte et al. ............ 257/295 |
| 2003/0012050 | A1 * | 1/2003 | Iwasaki ............... 365/171 |

FOREIGN PATENT DOCUMENTS

| | | |
|---|---|---|
| JP | 11-238924 | 2/1998 |
| JP | 2003-092412 | 9/2001 |
| JP | 2003-152173 | 11/2001 |
| WO | WO 01/69655 A2 | 3/2001 |
| WO | WO 01/99137 A2 | 6/2001 |
| WO | WO 01/099137 A3 | 6/2001 |
| WO | WO 0169655 * | 9/2001 |

OTHER PUBLICATIONS

D. J. Monsma et al., "Perpendicular Hot Electron Spin-Valve Effect in a New Magnetic Field Sensor: The Spin-Valve Transistor", Physical Review Letters, vol. 74, No. 26, Jun. 26, 1995, pp. 5260-5263.

K. Mizushima et al., "Energy-Dependent Hot Electron Transport Across a Spin-Valve", IEEE Transactions on Magnetics, vol. 33, No. 5, Sep. 1997, pp. 3500-3504.

Sebastia van Dijken et al., "Room Temperature Operation of a High Output Current Magnetic Tunnel Transistor", Applied Physics Letters, vol. 80, No. 18, May 6, 2002, pp. 3364-3366.

M. Tanaka et al., "Epitaxial Growth and Properties of III-V Based Magnetic Semiconductor and Ferromagnet/Semiconductor Heterostructures", The Magnetics Society of Japan (Mar. 18, 1999), pp. 13-20, and English translation, 4 pages.

International Search Report dated Nov. 11, 2003.

Supplementary Partial European Search Report for PCT/JP03/09438 dated Oct. 30, 2007.

Hao, X. et al., "Spin-filter effect of ferromagnetic europium sulfide tunnel barriers", Physical Review B, vol. 42, No. 13, Nov. 1, 1990, pp. 8235-8243.

Supplementary European Search Report for Appl. No. 03771333.6 - 2203, PCT/JP0309438, dated May 8, 2008.

* cited by examiner

SPIN TRANSISTOR BASED ON THE SPIN-FILTER EFFECT AND A NON-VOLATILE MEMORY USING SPIN TRANSISTORS

TECHNICAL FIELD

The present invention relates to a novel transistor, and more particularly to a transistor the output characteristics of which depend on the direction of spin of a carrier, and to a nonvolatile memory circuit (nonvolatile memory) utilizing the transistor.

BACKGROUND ART

Conventionally, semiconductor memories used in electronic devices such as microcomputers have mainly employed dynamic random access memories (DRAMs) from the viewpoint of operating speed and the degree of device integration. It is difficult, however, for DRAMs to accommodate the recent demands for lower energy consumption and mobility because DRAMs consume energy for memory storage purposes and the stored data is lost once power supply is turned off. In order to address such demands, a novel memory is required that is nonvolatile as well as fast, highly integrated, and energy-saving.

Magnetoresistive random access memories (MRAMs) are now gaining attention as a next-generation memory with the nonvolatile property, in addition to being capable of achieving operating speeds and levels of integration comparable to those of DRAMs. The MRAM stores information in terms of the direction of magnetization of a ferromagnet. The relative magnetization configuration of the information stored in the MRAM is electrically sensed utilizing the giant magnetoresistance effect in a spin valve element, or the tunneling magnetoresistance (TMR) effect in a magnetic tunnel junction (MTJ). Since MRAMs utilize a ferromagnet, they can hold information in a nonvolatile manner without consuming energy.

FIG. 17 shows a typical cell configuration of an MRAM utilizing a MTJ. As shown in FIG. 17(A), the MRAM comprises a 1-bit memory cell consisting of one MTJ and one metal oxide semiconductor (MOS) transistor. The gate of the MOS transistor is connected to a wordline for sensing, the source is grounded, and the drain is connected to one end of the MTJ. The other end of the MTJ is connected to a bitline.

As shown in FIG. 17(B), the MTJ has a tunnel junction structure consisting of two ferromagnetic electrodes separated by a thin insulating film. The MTJ provides the TMR effect in which tunnel resistance varies depending on the relative magnetization configuration of the two ferromagnetic electrodes. The rate of change of TMR between the case where the two ferromagnetic electrodes carry parallel magnetization and the case where they carry antiparallel magnetization is referred to as the TMR ratio, which is used for the evaluation of the TMR effect.

In the MRAM, information is stored in terms of the configuration of magnetization of the MTJ. Specifically, the relative magnetization configuration of the two ferromagnetic electrodes is rendered either parallel or antiparallel using a composed magnetic field formed by magnetic fields induced by currents that are caused to flow through the bitline and a wordline for writing (not shown) disposed perpendicular to the bitline.

When sensing information stored in a particular cell, a voltage is applied to a specific wordline for sensing connected to the cell so as to bring the MOS transistor into conduction, so that a current for sensing (to be hereafter referred to as a "drive current") flows through the MTJ via a specific bitline connected to the cell. A voltage dropped across the MTJ due to the TMR effect is then detected as an output voltage to sense the stored information.

SUMMARY OF THE INVENTION

Because the MRAMs based on MTJ employ ferromagnets, they are nonvolatile, energy-saving, and fast. In addition, their simple cell structure renders the MRAMs suitable for high-density integration. However, before the MRAM can be realized as a next-generation nonvolatile memory, the following problems must be overcome.

(1) An MTJ exhibits two resistance values corresponding to parallel and antiparallel magnetization, and an MRAM detects these resistance values as output voltages by causing a drive current to flow through the MTJ. Thus, in order to obtain a high output voltage, the tunnel resistance must be optimized by adjusting the thickness of the MTJ insulating film. However, since the TMR ratio also depends on the insulating film thickness, optimization of the tunnel resistance is limited.

(2) Further, if the stored information is to be sensed accurately, the TMR ratio must be increased such that a high ratio of output voltages of the two magnetization configurations, i.e., parallel and antiparallel, can be obtained. In order to achieve a high TMR ratio, a ferromagnet with a large spin polarization must be employed, and also the method of forming an insulating layer and its material and thickness, for example, must be optimized.

(3) In an MRAM utilizing a MTJ, the bias applied to the MTJ must be increased in order to increase the operating speed. However, the MTJ has the fundamental problem that, as the voltage drop across the ferromagnetic electrodes increases, the TMR ratio drops. Thus, the rate of change of output voltages due to TMR decreases as the voltage applied to the MTJ increases. This phenomenon is inherently based on the TMR effect and hard to avoid as long as the configuration of magnetization is sensed based solely on the TMR effect.

Thus, in order to detect information stored in a MTJ with high sensitivity, the output voltages must be optimized by adjusting the impedance (junction resistance) of the MTJ. It is also necessary to increase the output signal ratio of the two magnetization configurations, namely, parallel and antiparallel, by increasing the TMR ratio. At the same time, the TMR ratio must be prevented from being lowered by biasing.

All of the aforementioned problems can be overcome if output signal characteristics can be freely designed in terms of peripheral circuitry regardless of the characteristics of the memory elements.

It is therefore an object of the present invention to provide a nonvolatile memory in which information is stored in terms of the magnetization configuration of a ferromagnet contained in a transistor and in which the information is sensed using the output characteristics of the transistor that depend on the direction of spin of the carrier.

In one aspect, the present invention provides a transistor comprising: a spin injector for injecting spin-polarized hot carriers by a spin-filter effect; and a spin analyzer for selecting the thus injected spin-polarized hot carriers by the spin-filter effect. Thus, the output characteristics of the transistor can be controlled depending on the spin direction of the spin polarized hot carriers.

The spin injector preferably comprises a first ferromagnetic barrier layer, a first nonmagnetic electrode layer joined to one end surface of the first ferromagnetic barrier layer, and a second nonmagnetic electrode layer joined to the other end surface of the first ferromagnetic barrier layer.

The spin analyzer preferably comprises: a second ferromagnetic barrier layer; the second nonmagnetic electrode layer; and a third nonmagnetic electrode layer joined to the other end surface of the second ferromagnetic barrier layer. The second nonmagnetic electrode layer is joined to one end surface of the second ferromagnetic barrier layer. The second nonmagnetic electrode layer is common to the spin injector and the spin analyzer.

The first and second ferromagnetic barrier layers preferably comprise an insulating ferromagnetic semiconductor or a ferromagnetic insulator. The energy band edge of these ferromagnetic barrier layers is preferably formed by an up-spin band or a down-spin band due to spin splitting. The thickness of the second nonmagnetic electrode layer is preferably not greater than the mean free path of the spin polarized hot carriers in the second nonmagnetic electrode layer.

In the spin injector, the tunneling probability with respect to the carriers with a spin parallel to the spin band forming the band edge of the first ferromagnetic barrier layer is large, whereas that with respect to the carriers with an antiparallel spin is small. Thus, carriers with a parallel spin with the spin band forming the band edge of the first ferromagnetic barrier layer can be injected from the first nonmagnetic electrode to the second nonmagnetic electrode layer as hot carriers.

On the other hand, the spin analyzer, due to the spin-splitting at the band edge of the second ferromagnetic barrier layer, allows the spin-polarized hot carriers to be transported to the third nonmagnetic electrode layer when the spin direction of the spin-polarized hot carriers injected into the second nonmagnetic electrode is parallel to the spin direction of the spin band at the band edge of the second ferromagnetic barrier layer. However, the spin analyzer does not allow the spin-polarized hot carriers to be transported to the third ferromagnetic electrode when the spin direction of the spin-polarized hot carriers is antiparallel to that of the spin band at the band edge of the second ferromagnetic barrier layer.

Thus, even under the same bias condition, the output characteristics of the transistor depend on the relative magnetization configuration of the first ferromagnetic barrier layer and second ferromagnetic barrier layer. Specifically, the current transfer ratio or current gain is large when the first ferromagnetic barrier layer and second ferromagnetic barrier layer have parallel magnetization and it is small when they have antiparallel magnetization.

The invention also provides a nonvolatile memory circuit in which information can be stored in terms of the relative magnetization configuration of the second ferromagnetic barrier layer and the first ferromagnetic barrier layer, and in which the information can be sensed using the output characteristics of the transistor that depend on the magnetization configuration. In this memory circuit, a memory cell can be configured with a single transistor.

In another aspect, the invention provides a nonvolatile memory circuit comprising a spin transistor containing a ferromagnet and having output characteristics that depend on the spin direction of the carriers, a means for storing information in terms of the relative magnetization configuration of the ferromagnet, and a means for electrically sensing information stored in the spin transistor using the output characteristics.

The spin transistor preferably comprises at least one ferromagnet (to be hereafter referred to as a "free layer") in which the relative magnetization configuration can be independently controlled, and at least one ferromagnet in which the relative magnetization configuration is not changed (to be hereafter referred to as a "pin layer"). Stored information is retained in the form of a first state in which the relative magnetization configuration of the free layer is the same as that of the pin layer, or a second state in which their magnetization configurations are different.

Preferably, the spin transistor comprises: a first electrode structure for injecting spin-polarized carriers; a second electrode structure for receiving the spin-polarized carriers; and a third electrode structure for controlling the amount of the spin-polarized carriers transported from the first electrode structure to the second electrode structure. The pin layer and the free layer are preferably included in any of the first to third electrode structures.

The invention also provides a memory circuit comprising: the aforementioned spin transistors arranged in a matrix; a wordline connected to the third electrode structures; a first line connecting the first electrode structures to ground; and a bitline connected to the second electrode structures. A plurality of wordlines are extended in the column direction, and a plurality of bitlines are extended in the direction (the row direction) perpendicular to the column direction. The spin transistors are disposed near the intersections of the wordlines and bitlines.

In the aforementioned memory circuit, the magnetization in the free layer can be reversed by a magnetic field induced by a current caused to flow through a first separate line and a second separate line intersecting one another above the spin transistor in an electrically insulated manner, whereby the relative magnetization configuration between the free layer and the pin layer can be changed so that information can be stored (or written).

It is possible to use the wordline and/or the bitline instead of the first separate line and/or the second separate line.

In the aforementioned memory circuit, information can be sensed using the output characteristics of the spin transistor when the free layer and the pin layer in the spin transistor have parallel magnetization.

The memory circuit may comprise an output terminal formed on one end of each bitline, and a second line branching from each bitline and connected to a power supply via a load.

In this case, the information can be sensed from an output voltage obtained from the voltage drop across the load due to a current through the first and second electrode structures of the spin transistor, the output voltage depending on the relative magnetization configuration between the free layer and the pin layer.

Using the aforementioned circuit, a high-integration density and high-speed nonvolatile memory circuit can be provided in which the output voltages depending on the magnetization configuration within the transistor can be designed via the load and power supply.

BRIEF DESCRIPTION OF THE DRAWINGS

FIG. 1 (A) shows a schematic cross section. FIG. 1 (B) shows an energy band diagram of a conduction band (or a valence band) of the structure shown in FIG. 1 (A), together with the spin direction of a spin band in the barrier layer.

FIG. 2 (A) shows a case where the relative magnetization configuration of the first and second ferromagnetic barrier layers is parallel. FIG. 2 (B) shows a case where the relative magnetization configuration of the first and second ferromagnetic barrier layers is antiparallel.

FIG. 3 (A) shows the characteristics in a case where the magnetization configuration between the ferromagnetic barrier layers of the emitter and collector is parallel, while FIG. 3 (B) shows the characteristics in the case of antiparallel magnetization.

FIG. 4 (B) shows an example of a memory circuit. The vertical axis of FIG. 4 (C) shows collector current $I_C$, and the horizontal axis shows collector-emitter voltage $V_{CE}$, together with the $I_C$-$V_{CE}$ characteristics of the spin-filter transistor 1 and a load line due to a load resistor.

FIG. 5 (B) schematically shows an example of the output characteristics of a voltage-driven spin transistor.

FIG. 6 (B) shows an example of a memory circuit. The vertical axis of FIG. 6 (C) shows drain current $I_D$, and the horizontal axis shows drain-source voltage $V_{DS}$, the figure also showing the $I_D$-$V_{DS}$ characteristics of a voltage-driven spin transistor 150 and a load curve due to an active load in the same chart.

FIG. 16 (B) shows a cross section of a memory cell with a common-source configuration.

FIG. 17 (B) shows the operating principle of the MTJ.

BEST MODE FOR CARRYING OUT THE INVENTION

Figure 1:
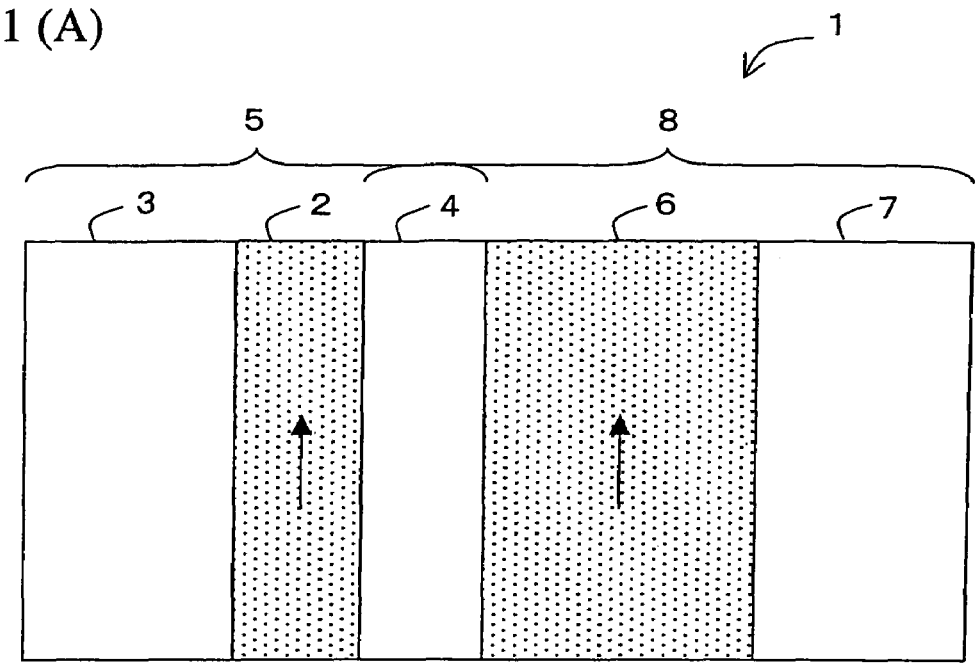
FIG. 1 shows the structure of a spin-filter transistor according to an embodiment of the invention.
Figure 1:
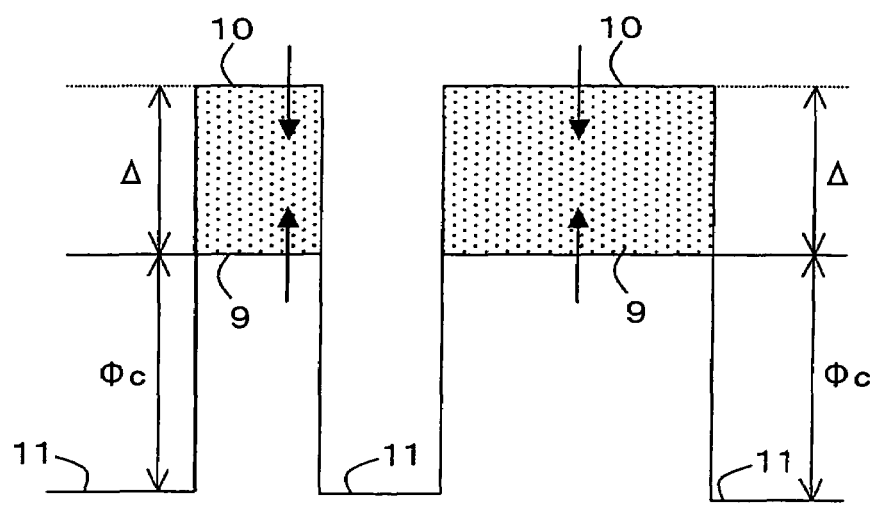

The transistor according to the present invention comprises a spin injector for injecting spin-polarized hot carriers having a specific spin direction, and a spin analyzer for selecting the thus injected spin-polarized hot carries by their spin directions. The spin injector comprises a first ferromagnetic barrier layer with such a thickness allowing for tunneling, such as Fowler-Nordheim tunneling or a direct tunneling; a first nonmagnetic electrode layer joined to one end surface of the first ferromagnetic barrier layer; and a second nonmagnetic electrode layer joined to the other end surface of the first ferromagnetic barrier layer. The spin analyzer comprises a second ferromagnetic barrier layer; a second nonmagnetic electrode layer joined to one end surface of the second ferromagnetic barrier layer; and a third nonmagnetic electrode layer joined to the other end surface of the second ferromagnetic barrier layer. The second nonmagnetic electrode layer is common to the spin analyzer and the spin injector. The thickness of the second nonmagnetic electrode layer is preferably not greater than the mean free path of the spin-polarized hot carriers in the nonmagnetic electrode layer.

When the above-described structure is compared with that of a conventional hot electron transistor, the first nonmagnetic electrode layer and the first ferromagnetic barrier layer correspond to the emitter and the emitter barrier, respectively; the second nonmagnetic electrode layer corresponds to the base; and the second ferromagnetic barrier layer and the third nonmagnetic electrode layer correspond to the collector barrier and the collector, respectively.

The first and second ferromagnetic barrier layers comprise an insulating ferromagnetic semiconductor or a ferromagnetic insulator. The energy bands of these ferromagnetic barrier layers are spin-split by magnetic exchange interaction, and only an up-spin band or a down-spin band exists at the band edges due to this spin splitting. The energy width in which only one of the spin bands exists is referred to as a spin-split width.

The spin-filter effect of the spin injector takes advantage of the following fact. Namely, in the tunneling effect, such as Fowler-Nordheim (FN) tunneling or a direct tunneling, in which a voltage is applied to the first ferromagnetic barrier layer via the first nonmagnetic electrode layer and the second nonmagnetic electrode layer, those of the carriers in the first nonmagnetic electrode layer that have a spin direction corresponding to that of the spin band at the band end of the first ferromagnetic barrier layer (the spin direction being antiparallel to the magnetization of the first ferromagnetic barrier layer when the carriers are electrons, or parallel to the magnetization of the first ferromagnetic barrier layer when the carriers are hole) have a large tunneling probability, whereas those with a spin direction that does not correspond (the spin direction being parallel to the magnetization of the first ferromagnetic barrier layer when the carriers are electrons, or antiparallel to the first ferromagnetic barrier layer when the carriers are holes) have a small tunneling probability.

The spin-filter effect of the spin analyzer takes advantage of the fact that, when injecting spin-polarized hot carriers from the spin injector into the spin-split band of the second ferromagnetic barrier layer, the spin-polarized hot carriers are transported through the spin band in the second ferromagnetic layer and arrive at the third nonmagnetic electrode layer when the spin direction of the injected spin-polarized hot carriers is parallel to that of the spin band at the band edge of the second ferromagnetic barrier layer (where the first and second ferromagnetic barrier layers have parallel magnetization), whereas when the spin direction at the band edge of the second ferromagnetic barrier layer is antiparallel to that of the spin-polarized hot carriers (where the first and second ferromagnetic barrier layers have antiparallel magnetization), the spin-polarized hot carriers cannot be transported through the second ferromagnetic barrier layer.

In this arrangement, the carriers in the first nonmagnetic electrode layer with the spin direction parallel to that of the spin band at the band edge of the first ferromagnetic barrier are injected as spin-polarized hot carriers into the second nonmagnetic electrode layer by tunneling, such as Fowler-Nordheim tunneling or a direct tunneling. The transistor is biased such that the energy of the thus injected spin-polarized hot carriers is larger than the energy of the spin band edge of the second ferromagnetic barrier layer and smaller than the energy of the spin band edge to which the spin-split width has been added. Since the thickness of the second nonmagnetic electrode layer is not greater than the mean free path of the spin-polarized hot carriers in the second nonmagnetic electrode layer, the injected spin-polarized hot carriers arrive at the second ferromagnetic barrier layer without losing energy. In addition, the energy of the spin-polarized hot carriers is larger than that of the spin band edge at the band edge of the second ferromagnetic barrier layer and is smaller than the energy of the spin band edge to which the spin-split width has been added. Therefore, when the spin direction of the injected spin-polarized hot carriers is parallel to the spin direction of the spin band at the band edge of the second ferromagnetic barrier layer, the spin-polarized hot carriers are transported within the spin band by an electric field produced in the second ferromagnetic barrier layer, and transported to the third nonmagnetic electrode layer, producing a current that flows between the third nonmagnetic electrode layer and the first nonmagnetic electrode layer.

On the other hand, when the spin direction of the injected spin-polarized hot carriers is antiparallel to the spin direction of the spin band at the band edge of the second ferromagnetic barrier layer, the spin-polarized hot carriers are scattered (or reflected) by the boundary between the second nonmagnetic electrode layer and the second ferromagnetic barrier layer, producing a current that flows between the second nonmagnetic electrode layer and the first nonmagnetic electrode layer.

Thus, depending on whether the relative magnetization configuration of the first ferromagnetic barrier layer and the second ferromagnetic barrier layer, namely, whether they are parallel or antiparallel, the current that flows in the first ferromagnetic barrier layer can be switched to a current that flows between the third nonmagnetic electrode layer and the first nonmagnetic electrode layer via the second ferromagnetic barrier layer, or a current that flows between the second nonmagnetic electrode layer and the first nonmagnetic electrode layer. Namely, the current through the second ferromagnetic barrier layer can be controlled by the relative magnetization configuration of the first ferromagnetic barrier layer and the second ferromagnetic barrier layer. When compared with the operation of known common-base or common-emitter hot electron transistors or bipolar transistors, the above-described operation of the present embodiment corresponds to controlling the collector current by means of the base current. However, in the transistor of the present embodiment, the factor of amplification of the collector current by the base current can be controlled by the relative magnetization configuration of the first ferromagnetic barrier layer and the second ferromagnetic barrier layer. Thus, the transistor of the present embodiment is capable of controlling the current gain, whereby collector current can be controlled not only by the base current (or the bias voltage between the first and second nonmagnetic electrodes), but also by the relative magnetization configuration of the first ferromagnetic barrier layer and the second ferromagnetic barrier layer.

Furthermore, when the coercive forces of the first ferromagnetic barrier layer and the second ferromagnetic barrier layer are varied, or when the relative magnetization configuration of one of them is fixed, the relative magnetization configuration of the first ferromagnetic barrier layer and the second ferromagnetic barrier layer can be changed to be parallel or antiparallel as desired by applying a magnetic field of an appropriate intensity such that the relative magnetization configuration of either the first ferromagnetic barrier layer or the second ferromagnetic barrier layer is reversed. Namely, information can be stored in the transistor.

Thus, a memory cell can be configured with the above-described transistor. An example of a nonvolatile memory utilizing the transistor of the present embodiment will be hereafter described. The second nonmagnetic electrode layer of the transistor of the embodiment is connected to a word-line, and the third nonmagnetic electrode layer of the transistor is connected to a bitline. The bitline is connected to a power supply via a load, and the first nonmagnetic electrode layer of the transistor is grounded. In this arrangement, when a specific wordline is selected and a bias is applied to the second nonmagnetic electrode layer, the output voltage (voltage that appears at the third nonmagnetic electrode) detected by selecting a specific bitline is seen to vary depending on the relative magnetization configuration of the first ferromagnetic barrier layer and the second ferromagnetic barrier layer of the transistor. Namely, when the relative magnetization configuration are parallel, the output voltage becomes smaller, while when the relative magnetization configuration is antiparallel, the output voltage becomes larger. Thus, the information that is stored can be sensed on the basis of the magnitude of the output voltage.

In the above-described nonvolatile memory, the transistor of the present embodiment is used as a common-emitter transistor, a power supply and a load are provided to the collector, and the collector voltage is obtained as the output voltage. Thus, using peripheral circuitry such as the power supply and load, desired output voltage values can be obtained when the first ferromagnetic barrier layer and second ferromagnetic barrier layer have parallel magnetization or when they have antiparallel magnetization. Accordingly, the above-described nonvolatile memory can overcome the aforementioned problems of the MRAM based on MTJ, the problems being that the tunnel resistance as well as output voltages are small, that the TMR ratio is so small that the information that is stored is hard to be distinguished, and that the ratio of output voltages decreases due to the applied bias.

In the following, the configuration and operation of the above-described transistor is described in greater detail with reference made to the drawings. The transistor of the present embodiment will be hereafter referred to as a "spin-filter transistor" for facilitating the understanding of the description of the invention.

FIG. 1 shows the configuration of a spin-filter transistor according to the present embodiment. FIG. 1 (A) shows a schematic cross section. FIG. 1 (B) shows an energy band of the conduction band (or the valence band) of the configuration shown in FIG. 1 (A), also showing the spin direction of the spin band in the barrier layer. When the carriers are holes, the direction of magnetization at the band edge corresponds to the spin direction; when the carriers are electrons, the relative magnetization configuration is opposite to that of the spin direction of the band edge.

A spin-filter transistor 1 according to the present embodiment comprises a spin injector 5 comprising: a first ferromagnetic barrier layer 2; a first nonmagnetic electrode layer 3 joined to one end surface of the first ferromagnetic barrier layer 2; and a second nonmagnetic electrode layer 4 joined to the other end surface of the first ferromagnetic barrier layer 2. The spin-filter transistor 1 also comprises a spin analyzer 8 comprising: a second ferromagnetic barrier layer 6; a second nonmagnetic electrode layer 4 joined to one end surface of the second ferromagnetic barrier layer 6; and a third nonmagnetic electrode layer 7 joined to the other end surface of the second ferromagnetic barrier layer 6. As will be seen from FIG. 1 (A), the spin injector 5 and the spin analyzer 8 shares the second nonmagnetic electrode layer 4.

The first, second, and third nonmagnetic electrode layers 3, 4, and 7 may be formed by a nonmagnetic metal, an n-type nonmagnetic semiconductor, or a p-type nonmagnetic semiconductor. The thickness of the second nonmagnetic electrode layer 4 is preferably not greater than the mean free path within the nonmagnetic electrode layer 4 of the spin-polarized hot carriers injected from the spin injector. By making the base width shorter than the mean free path, the current transfer ratio can be made 0.5 or greater, so that current amplification can be achieved.

The first and second ferromagnetic barrier layers 2 and 6 may comprise an insulating ferromagnetic semiconductor or a ferromagnetic insulator. The energy band of the ferromagnetic barrier layer is spin-split by magnetic exchange interaction, such that an energy region is created at the band edge where only an up spin or a down spin exists. Such a spin-polarized band is referred to as a spin band, and this energy region band is referred to as a spin-split width $\Delta$.

As shown in FIG. 1 (B), the solid lines with an arrow ↑ on the ferromagnetic barrier layers 2 and 6 indicate the edge of the band where an up spin can exist, namely, an up-spin band edge 9. The solid lines with an arrow ↓ indicate the edge of the band where a down spin can exist, namely, a down-spin band edge 10. The region between the up-spin band edge 9 and the down-spin band edge 10 in FIG. 1 (B) is a region where only an up spin can exist. A region with a higher energy than that of the down-spin band edge 10 is a region where both up spin and down spin can exist. While FIG. 1 (B) shows a case where the spin band of up spin is lower than the spin band of down spin, the opposite state is also possible.

The first ferromagnetic barrier layer 2 has a thickness such that the carriers can be transmitted from the first nonmagnetic electrode layer 3 to the second nonmagnetic electrode layer 4 by tunneling, such as Fowler-Nordheim tunneling (to be hereafter referred to as "FN tunneling") or a direct tunneling, in response to the application of a voltage to the first nonmagnetic electrode layer 3 and to the second nonmagnetic electrode layer 4. A direct tunneling refers to the phenomenon in which the carriers directly pass through a thin potential barrier. The FN tunneling refers to the phenomenon in which the tunneling current due to a direct tunneling can be ignored up to a certain applied voltage and in which the carriers tunnel through the triangular potential at the top of a potential barrier produced by the application of a voltage exceeding a certain value.

The voltage applied to the first nonmagnetic electrode layer 3 and the second nonmagnetic electrode layer 4 may be in the voltage range used in the conventional memory circuit, such as on the order of several hundred mV to several volts.

The second ferromagnetic barrier layer 6 needs to be sufficiently thick that there is no thermionic emission of the carriers or a current due to tunneling (the so-called leak current) from the second nonmagnetic electrode layer 4 to the third nonmagnetic electrode layer 7.

The nonmagnetic electrode layers 3, 4, 7 and the ferromagnetic electrode layers 2 and 6 form the energy band structure shown in FIG. 1 (B). Solid lines 11 in the nonmagnetic electrode layer FIG. 1 (B) indicate the Fermi energy of the metal, the Fermi energy of an n-type (p-type) semiconductor, or the energy at the bottom of the conduction band (at the top of the valence band). The lower energy barrier in the ferromagnetic barrier layers 2 and 6 corresponding to the solid lines 11 at the nonmagnetic electrode layer is indicated by $\phi_C$, and the spin-split width is indicated by $\Delta$. Although the ferromagnetic barrier layers 2 and 6 may have different values of $\phi_C$ and $\Delta$, the following description concerns a case where the ferromagnetic barrier layers 2 and 6 have the same values of $\phi_C$ and $\Delta$.

In the case where the carriers are electrons, a nonmagnetic metal or an n-type semiconductor is used for the nonmagnetic electrode layers 3, 4, and 7, and an insulating ferromagnetic semiconductor or a ferromagnetic insulator is used for the ferromagnetic barrier layers 2 and 6. In this case, the up-spin band edge 9 and the down-spin band edge 10 are produced by the spin splitting of the bottom of the conduction band of the ferromagnetic barrier layers 2 and 6. In the case where the carriers are holes, a p-type semiconductor is used for the nonmagnetic electrode layer 3, 4, 7, and an insulating ferromagnetic semiconductor or a ferromagnetic insulator is used for the ferromagnetic barrier layers 2 and 6. In this case, the up-spin band edge 9 and the down-spin band edge 10 of the ferromagnetic barrier layer 2 and 6 are produced by the spin splitting of the top of the valence band.

Hereafter, the operating principle of the above-described spin-filter transistor is described in detail. In the following description, the notational system for the hot electron transistor will also be used for simplicity's sake. Specifically, the first nonmagnetic electrode layer 3 and the first ferromagnetic barrier layer 2 will be referred to as an emitter 21, the second nonmagnetic electrode layer 4 will be referred to as a base 22, the second ferromagnetic barrier layer 6 and the third nonmagnetic electrode layer 7 will be referred to as a collector 23, the first nonmagnetic electrode layer 3 will be referred to as an emitter electrode 3, and the third nonmagnetic electrode layer 7 will be referred to as a collector electrode 7. The following also concerns the case where the carriers are electrons as an example (the case where the carriers are holes will not be described because such a case is substantially the same in terms of operating principle).

Figure 2:
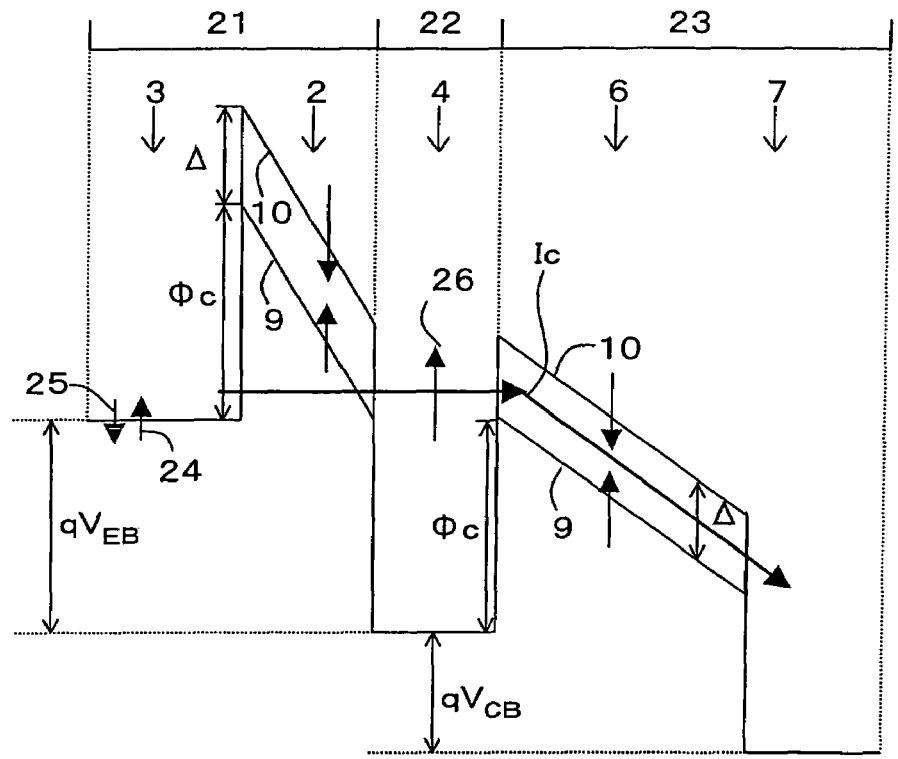
FIG. 2 shows an energy band diagram in a case where a common-base bias voltage is applied between the emitter (first nonmagnetic electrode layer) and collector (third nonmagnetic electrode layer) of the spin-filter transistor of the present embodiment.
Figure 2:
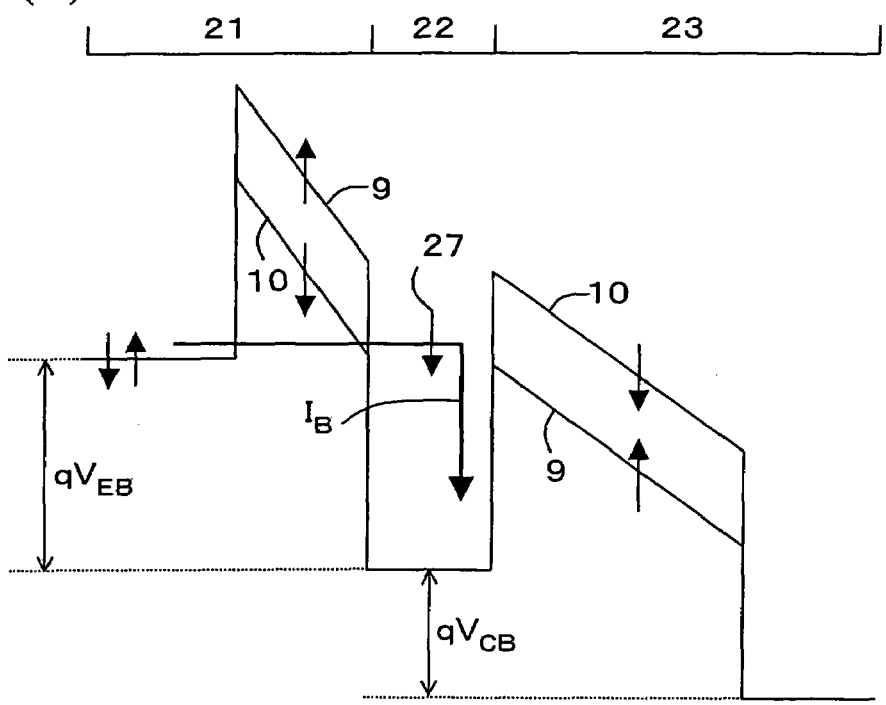

FIG. 2 shows energy band diagrams in a case where a common-base bias voltage is applied between the emitter, base, and collector of the spin-filter transistor of the present embodiment. FIG. 2 (A) shows a case where the magnetization configurations of the first and second ferromagnetic barrier layers are parallel to each other, and FIG. 2 (B) shows a case where the magnetization configurations of the first and second ferromagnetic barrier layers are antiparallel to each other, corresponding to FIG. 2 (A). A bias voltage $V_{EB}$ is applied across emitter 21 and base 22, and a bias voltage $V_{CB}$ is applied across base 22 and collector 23. The magnitude of $V_{EB}$ is set such that the relationship ($\Phi_C < qV_{EB} < \Phi_C + \Delta$) is satisfied, where q is the elementary charge.

The emitter 21 functions as a spin injector for injecting spin-polarized hot electrons to base 22. Thus, when causing the carriers to pass through the first ferromagnetic barrier layer 2 from the emitter electrode 3 by tunneling using the bias voltage $V_{EB}$, since the conduction band of the first ferromagnetic barrier layer 2 is spin-split, the barrier height for the up-spin electrode 24 and that for the down-spin electrode 25 in the emitter electrode 3 are different.

Namely, in FIG. 2 (A), the barrier height for the up-spin electrode 24 corresponds to the energy up to an up-spin band edge 9 of the first ferromagnetic barrier layer 2, or $\Phi_C$. The barrier height for the down-spin electrode 25 corresponds to the energy up to a down-spin band edge 10 of the first ferromagnetic barrier layer 2, or $\Phi_C+\Delta$. Thus, by controlling the base-emitter voltage, electrons with a spin for which the barrier height is lower, namely, an up spin, which correspond to electrons 24 in the illustrated example, can be selectively tunnel-injected to the base 22 (in a phenomenon called "spin-filter effect") as hot electrons.

The collector 23 of the spin-filter transistor functions as a spin analyzer for selecting the direction of the spin-polarized hot electrons injected into the base 22. Specifically, the spin-polarized electrons 26 that have been rendered into hot electrons by the bias voltage $V_{EB}$ and injected into the base 22 can arrive at the boundary between base 22 and collector 23 without losing energy, or "ballistically," because the width of base 22 is set to be not greater than the mean free path of the spin-polarized hot electrons 26. In the second ferromagnetic barrier layer 6 of collector 23, there is also produced two barriers with different barrier heights due to the spin splitting of the conduction band. As shown in FIG. 2 (A), when the magnetization configurations of the first and second ferromagnetic barrier layers 2 and 6 are parallel to each other, because the up-spin band edge 9 of the second ferromagnetic barrier layer 6 having a spin parallel to that of the spin-polarized hot electrons 26 is lower than the energy of the spin-polarized hot electrons 26, the spin-polarized hot electrons 26 are transported to the collector electrode 7 across the second ferromagnetic barrier layer 6, thereby producing a collector current $I_C$.

On the other hand, when the magnetization configurations of the first and second ferromagnetic barrier layers 2 and 6 are antiparallel to each other, as shown in FIG. 2 (B), spin-polarized hot electrons 27 with down spin are injected to a base 22. In this case, however, because the down-spin band edge 10 of the second ferromagnetic barrier layer 6 with down spin is higher than the energy of the spin-polarized hot electrons 27, the spin-polarized hot electrons 27 cannot be transported through the conduction band of the second ferromagnetic barrier layer 6. Instead, they lose energy as they are subjected to spin-dependent scattering (or reflection) at the boundary between base 22 and collector 23, resulting in a flow of base current $I_B$.

Thus, the current transfer ratio of the current that flows from the emitter to the collector greatly differs depending on the relative magnetization configuration of the first ferromagnetic barrier layer 2 of emitter 22 and the second ferromagnetic barrier layer 6 of collector 23. In other words, the current gain of collector current due to base current greatly differs.

Figure 3:
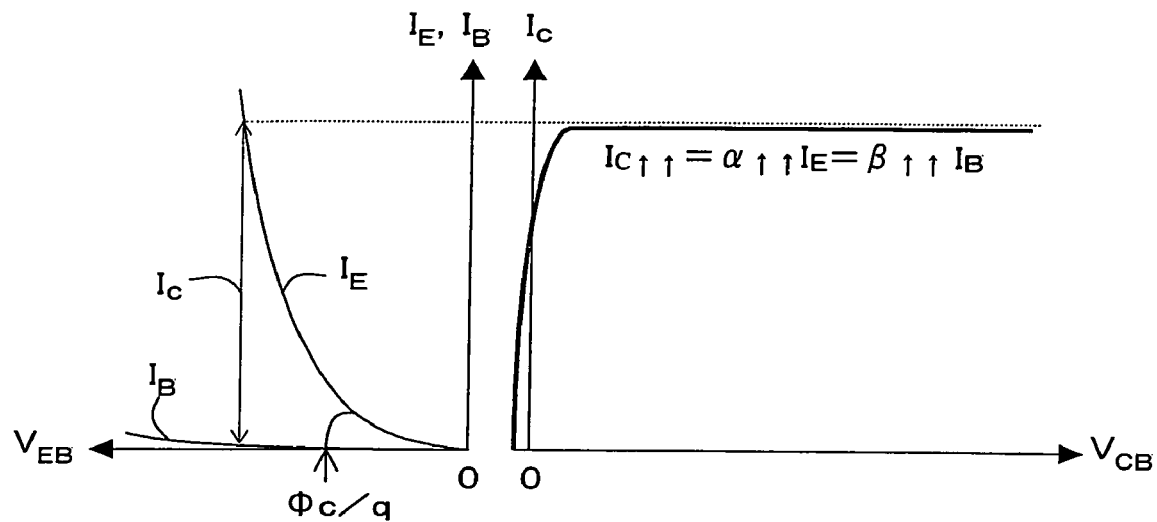
FIG. 3 shows the static characteristics of the spin-filter transistor of the present embodiment in a common-base configuration. The horizontal axis shows collector-base voltage $V_{CB}$ to the right and emitter-base voltage $V_{EB}$ to the left at the top of the figure. The vertical axis shows emitter current $I_E$, base current $I_B$, and collector current $I_C$.
Figure 3:
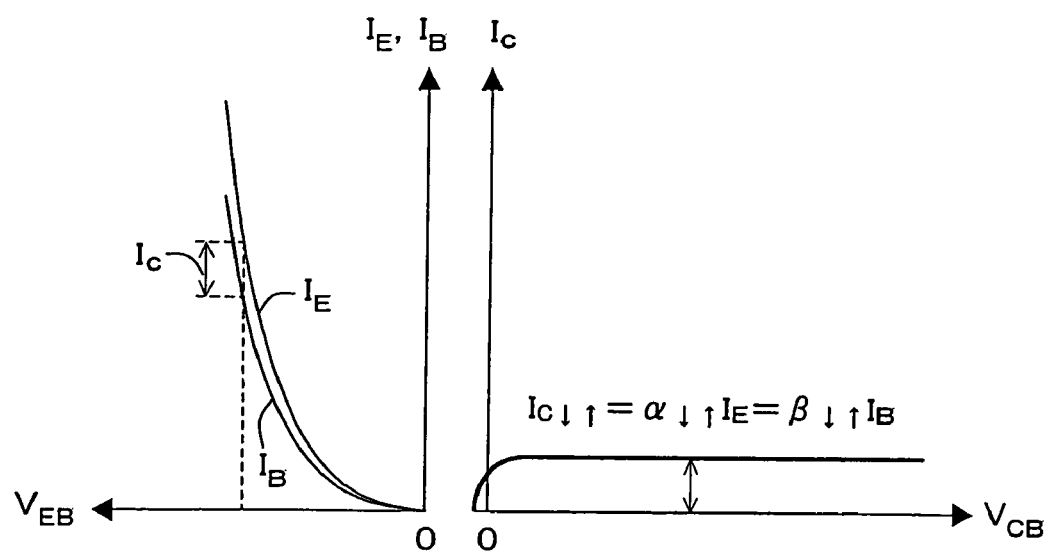

FIG. 3 shows the static characteristics of the spin-filter transistor of the present embodiment in a common-base configuration. The horizontal axis shows collector-base voltage $V_{CB}$ in the upper-right portion and emitter-base voltage $V_{EB}$ to the left. The vertical axis shows emitter current $I_E$, the base current $I_B$, and collector current $I_C$. FIG. 3 (A) shows the static characteristics in a case where the magnetization configurations of the ferromagnetic barrier layers of the emitter and the collector are parallel. FIG. 3 (B) shows the static characteristics when the magnetization configurations are antiparallel. In both FIG. 3 (A) and (B), α indicates the current transfer ratio, β indicates the current gain, and the subscripts ↑↑ and ↓↑ indicate the parallel and antiparallel relative magnetization configuration, respectively, of the ferromagnetic barrier layers of the emitter and collector.

As shown in FIG. 3 (A), when the magnetization configurations of the emitter and the collector are parallel, most of the emitter current $I_E$ can serve as the collector current $I_C$. As shown in FIG. 3 (B), when the magnetization configurations are antiparallel, most of the emitter current $I_E$ can serve as the base current $I_B$. As in the known hot electron transistors or bipolar transistors, the collector current $I_C$ can be controlled by the base current $I_B$ in the transistor of the present embodiment. In addition, the current gain can be controlled by the relative magnetization configuration of the first and second ferromagnetic barrier layers.

The ferromagnetic barrier layer of the spin-filter transistor of the present embodiment may comprise a ferromagnetic semiconductor, such as EuS, EuSe, or EuO, for example. It may also comprise a ferromagnetic insulator, such as $R_3Fe_5O_{12}$ (where R is a rare-earth element). The nonmagnetic electrode layer may comprise any material as long as it is nonmagnetic. Examples include metals, such as Al and Au, and nonmagnetic semiconductors, such as Si and GaAS, that have been doped with a high concentration of impurity. When, for example, the ferromagnetic barrier layer comprises EuS and the nonmagnetic electrode layer comprises Al, the barrier height $\Phi_C$ is 1.4 eV and the spin-split width $\Delta$ is 0.36 eV. The spin-filter transistor of the present embodiment can be produced by a known method, such as molecular beam epitaxy, vacuum evaporation, or sputtering, using the above-described materials.

In the following, a nonvolatile memory comprising the spin-filter transistor of the present invention as a memory cell will be described.

Figure 4:
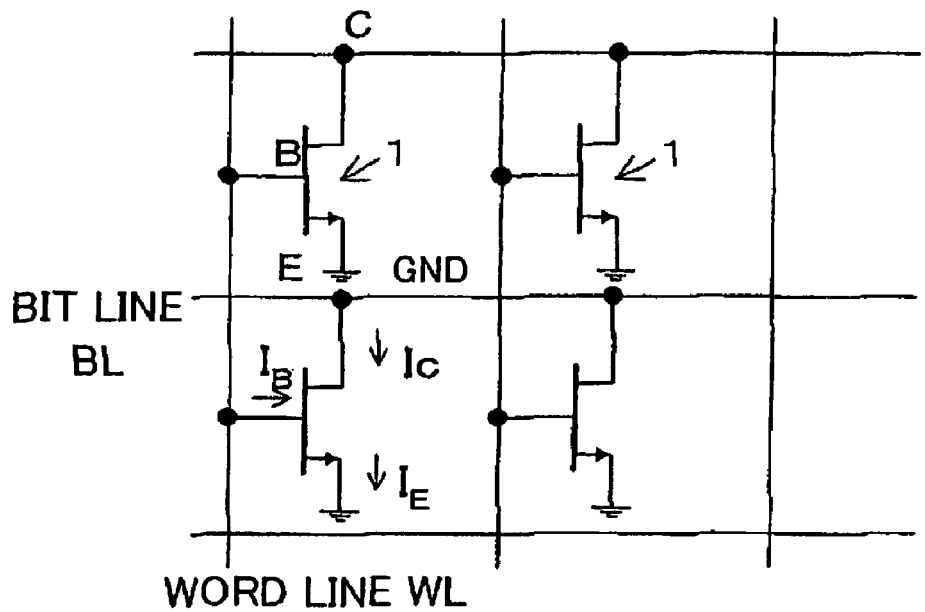
FIG. 4 (A) shows an example of a memory cell utilizing a spin-filter transistor 1 of the present embodiment.
Figure 4:
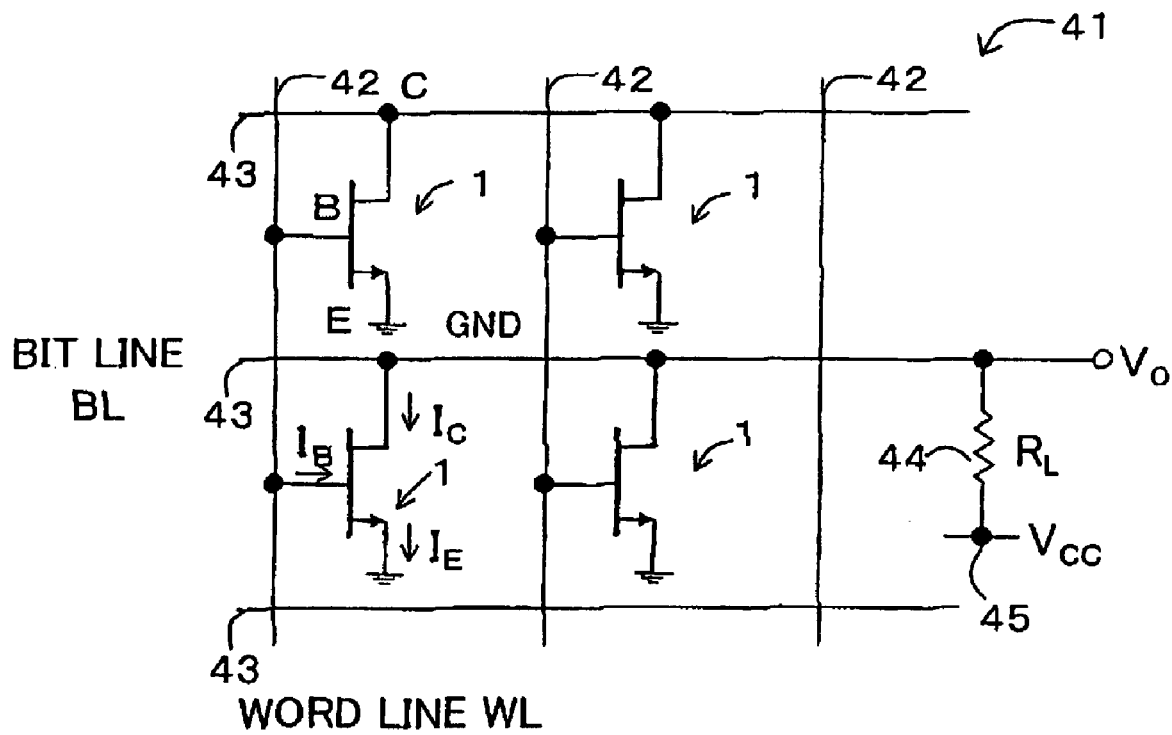
Figure 4:
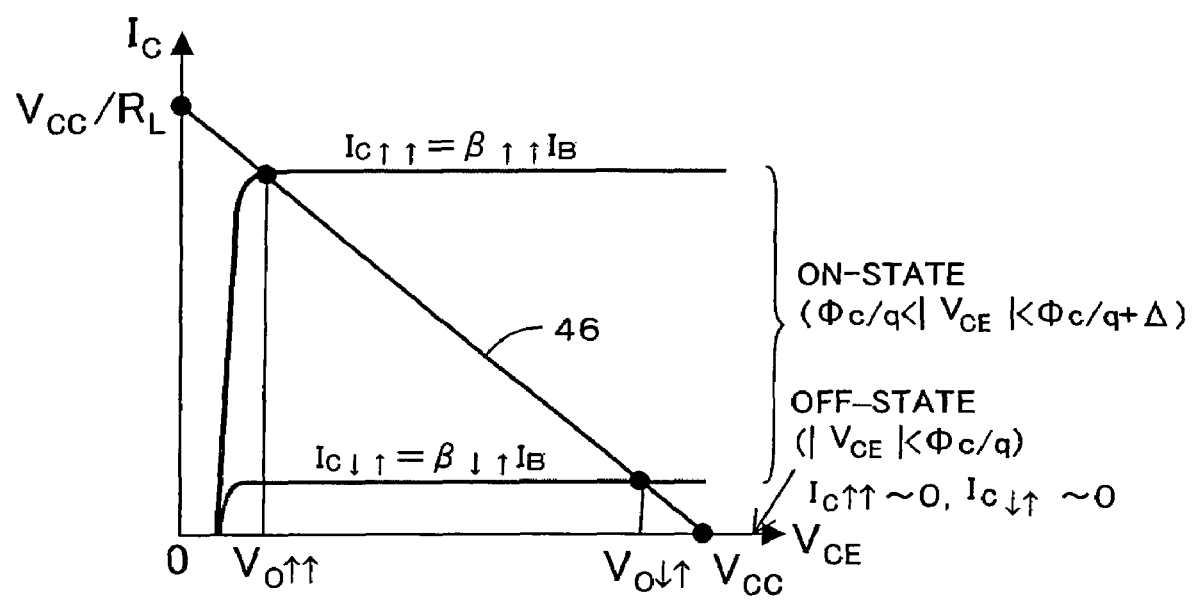

FIG. 4 (A) shows an example of a memory cell employing a spin-filter transistor 1 of the present embodiment. In the memory cell shown in FIG. 4 (A), a number of spin-filter transistors are arranged in a matrix, with the emitter terminals E grounded and the collector terminals C and the base terminals B connected to a bitline BL for sensing and a wordline WL for sensing, respectively. A wordline for writing intersects a bitline for writing above the spin-filter transistors such that these lines are electrically insulated from other wires. The wordline for writing and the bitline for writing may be combined with the aforementioned bitline BL for sensing and wordline WL for sensing, as shown in FIG. 4 (A). In the case of FIG. 4 (A), a memory cell can be formed by a single spin-filter transistor, and also a simple wiring arrangement can be adopted. Thus, the present memory cell arrangement makes it possible to easily configure a layout suitable for high-density integration. The example shown in FIG. 4 (B) also adopts a similar cell arrangement.

With reference to FIG. 4(B), a memory circuit according to the present embodiment will be described. In a memory circuit 41 of the present embodiment, a second nonmagnetic electrode 4, which is the base of the spin-filter transistor 1 (FIG. 1), is connected to a wordline 42; a third nonmagnetic electrode 7, which is the collector electrode of the spin-filter transistor 1, is connected to a bitline 43; the bitline 43 is connected to a power supply ($V_{CC}$) 45 via a load ($R_L$) 44; and a first nonmagnetic electrode 3, which is the emitter electrode of the spin-filter transistor 1, is connected to ground. Although a pure resistance is used as the load in the illustrated example, an active load consisting of a transistor may be used.

When sensing information stored in a specific memory cell, a specific wordline 42 is selected and a bias is applied across the emitter-base junction, and a power supply voltage $V_{CC}$ from the power supply 45 is applied to the bitline 43 via the load resistance 44. Then, the stored information is sensed using the magnitude of an output voltage $V_O$ that appears at the bitline 43. The vertical axis of FIG. 4 (C) shows collector current $I_C$. The horizontal axis shows collector-emitter voltage $V_{CE}$. The graph thus shows the $I_C$-$V_{CE}$ characteristics of the spin-filter transistor and a load line 46 of the load resistance 44 in the same chart.

The output voltage $V_O$ is determined by the intersection of these characteristics. Specifically, the output signals in the cases where the magnetization configuration between the first and second ferromagnetic barrier layers 2 and 6 is parallel and antiparallel would be $V_{O\uparrow\uparrow}$ and $V_{O\downarrow\uparrow}$, as shown in FIG. 4 (C). The absolute values of $V_{O\uparrow\uparrow}$ and $V_{O\downarrow\uparrow}$ and the ratio of $V_{O\uparrow\uparrow}$ and $V_{O\downarrow\uparrow}$ can be optimized by means of circuit parameters ($R_L$ and $V_{CC}$). Thus, using the nonvolatile memory device of the present embodiment, output signals of required magnitudes and a required ratio of output signals can be obtained without adjusting the structure of the elements themselves, as in a MTJ.

The spin-filter effect utilized by the transistor of the present embodiment is provided by the spin band splitting of the ferromagnet, such that a higher spin selectivity can be obtained than is possible with the TMR effect of MTJ. When the base width is set to be no more than the mean free path of the spin-polarized hot carriers, the current transfer ratio α (defined as being equal to $I_C/I_E$) can be 0.5 or more when the relative magnetization configuration between the first and second ferromagnetic barrier layers is parallel. However, when the relative magnetization configuration is antiparallel, the current transfer ratio is extremely small. Thus, the change in the current transfer ratio between parallel magnetization and antiparallel magnetization is even more amplified in terms of current gain β (defined as being equal to $I_E/I_B$). By optimizing the output signal using the above-described peripheral circuitry with reference to the output characteristics of the spin-filter transistor that vary greatly depending on the magnetization configuration, output signals of desired absolute values and their desired ratio can be easily obtained.

Hereafter a nonvolatile memory circuit utilizing a transistor (to be hereafter referred to as a "spin transistor") with output characteristics that depend on the spin direction of the carriers is described.

The memory circuit of the present invention relates to a nonvolatile memory circuit utilizing a spin transistor. A spin transistor includes a ferromagnet such as a ferromagnetic metal or a ferromagnetic semiconductor. The output characteristics are changed by controlling the spin direction of the carriers depending on the magnetization configuration of the ferromagnet. Information is stored in terms of the magnetization configuration of the ferromagnet inside the spin transistor, and the stored information is sensed using the output characteristics of the transistor that reflect the magnetization configuration inside the spin transistor. Using the spin transistor, a 1-bit nonvolatile memory cell can be configured with a single spin transistor. Furthermore, the value of the output signal corresponding to the stored information can be optimized by peripheral circuitry connected to the memory cell.

Specifically, the spin transistor comprises at least one each of a ferromagnet layer (free layer) capable of independently controlling the relative magnetization configuration using a magnetic field or the like, and a ferromagnet layer (pin layer) with a fixed relative magnetization configuration or having a larger coercivity than that of the free layer. The output characteristics of the transistor can be controlled by the relative magnetization configuration of the free layer and the pin layer even under the same bias condition. By changing the relative magnetization configuration of the free layer using a magnetic field, for example, the relative magnetization configuration of the free layer and the pin layer can be rendered into two configurations, namely, parallel or antiparallel. These two magnetization configurations are associated with binary stored information.

In the spin transistor, based on a conduction phenomenon that varies depending on the spin direction of the carrier, such as spin-dependent scattering, tunneling magnetoresistance effect, or spin-filter effect, output characteristics corresponding to the internal magnetization configuration of the transistor can be obtained. The spin transistor comprises a first electrode structure for injecting spin-polarized carriers, a second electrode structure for receiving the spin-polarized carriers, and a third electrode structure for controlling the quantity of spin-polarized carriers that are transported from the first electrode structure to the second electrode structure.

The spin transistors operate on the same principle as that of the conventional transistors with the exception of the involvement of the spin-dependent conduction phenomenon. Thus, the spin transistors can be classified into current-driven transistors such as bipolar transistors, and voltage-driven transistors such as field-effect transistors. In terms of the current-driven transistor, the first electrode structure corresponds to the emitter, the second electrode structure corresponds to the collector, and the third electrode structure corresponds to the base. The spin-filter transistor described with reference to the present embodiment is a current-driven transistor. In terms of the voltage-driven transistor, the first electrode structure corresponds to the source, the second electrode structure corresponds to the drain, and the third electrode structure corresponds to the gate. The output current in the spin transistor (collector current or drain current) changes depending on the magnetization configuration of the ferromagnet contained in the spin transistor even under the same bias condition.

The details of the spin transistor will be described later. In the following, the general output characteristics of a spin transistor and a nonvolatile memory employing a spin transistor will be described. It is assumed in the following that the relative magnetization configuration between the free layer and the pin layer can be rendered parallel or antiparallel by applying a magnetic field to the free layer in the spin transistor. It is also assumed that the magnetization configuration can exist stably unless a magnetic field exceeding the coercivity of the free layer is applied.

Figure 5:
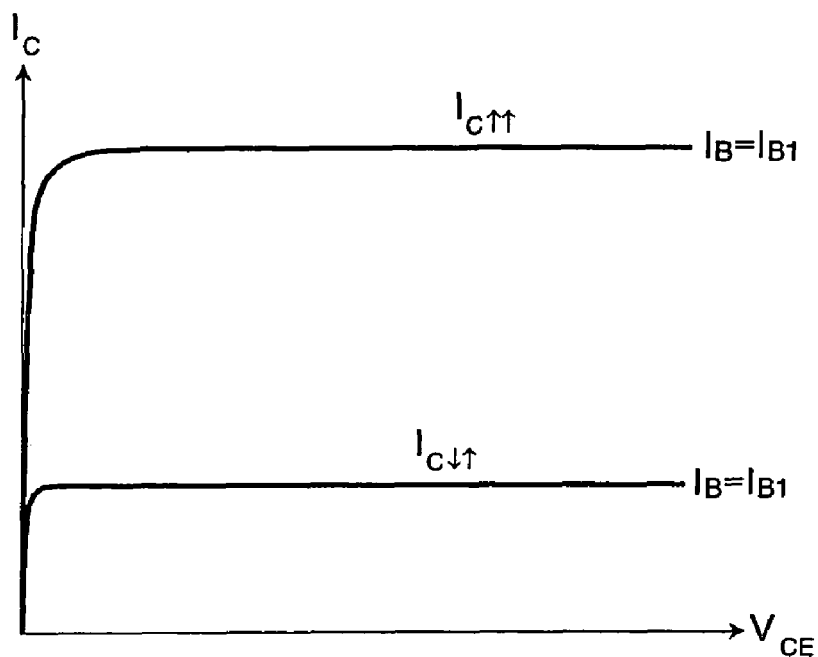
FIG. 5 (A) shows an example of the output characteristics of a current-driven spin transistor.
Figure 5:
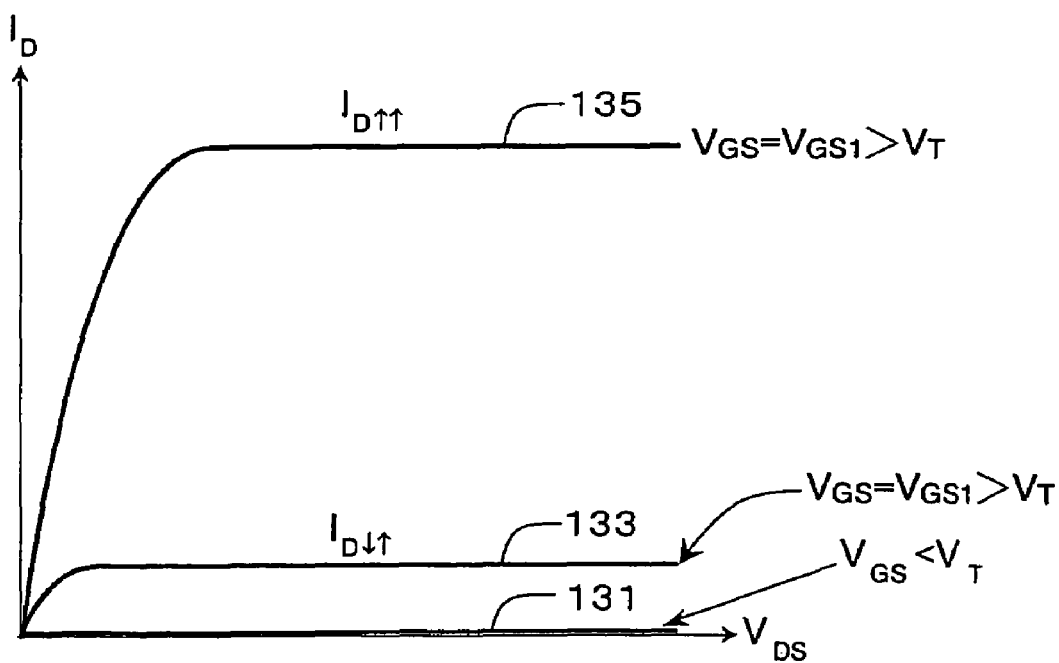

FIG. 5 (A) schematically shows an example of the output characteristics of a current-driven spin transistor. As in a conventional current-driven transistor, although the collector current $I_C$ can be controlled by the magnitude of the base current $I_B$, it is also dependent on the magnetization configuration of the ferromagnet contained in the spin transistor. In the example of FIG. 5 (A), even when the bias applied to the spin transistor is the same ($I_B=I_{B1}$), the collector current $I_{C\uparrow\uparrow}$ in the case of parallel magnetization is large, whereas the collector current $I_{C\downarrow\uparrow}$ in the case of antiparallel magnetization is small.

FIG. 5 (B) schematically shows an example of the output characteristics of a voltage-driven spin transistor. As in a conventional field-effect transistor, such as a MOS transistor, when the gate source voltage ($V_{GS}$) is smaller than the threshold value $V_T$ ($V_{GS}<V_T$), the spin transistor is in an off state where hardly any drain current flows. Although the spin transistor conducts when a $V_{GS}$ exceeding $V_T$ is applied, the drain current value differs depending on whether the ferromagnets contained in the spin transistor have parallel magnetization or antiparallel magnetization, even under the same bias condition ($V_{GS}=V_{GS1}$). In the case of FIG. 3 (B), the drain current $I_{D\uparrow\uparrow}$ is larger for parallel magnetization whereas the drain current $I_{D\downarrow\uparrow}$ is small for antiparallel magnetization.

Thus, the spin transistor, whether it is current-driven or voltage-driven, can electrically detect the magnitude of the relative magnetization configuration of the free layer and the pin layer contained in the device using the magnitude of the collector current or the drain current. As mentioned above, the relative magnetization configuration in the ferromagnet can exist stably unless a magnetic field exceeding the coercivity of the free layer is externally applied. Thus, the spin transistor can store binary information in a nonvolatile manner by rendering the relative magnetization configuration of the free layer and the pin layer contained in the device parallel or antiparallel. Therefore, using the spin transistor, a 1-bit nonvolatile memory cell can be configured with a single spin transistor.

In the following, a nonvolatile memory employing a voltage-driven spin transistor will be described. The same configuration can be adopted where a current-driven type spin transistor is used in a memory cell.

Figure 6:
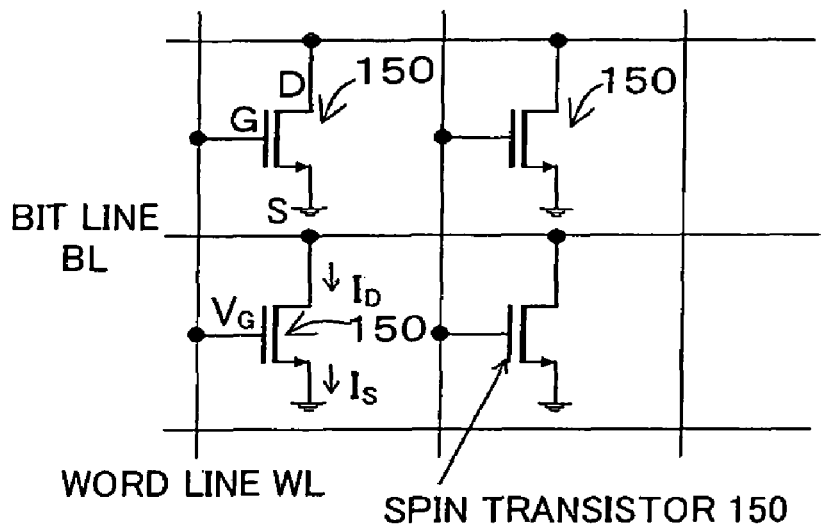
FIG. 6 (A) shows an example of a memory cell employing a voltage-driven spin transistor of the present embodiment.
Figure 6:
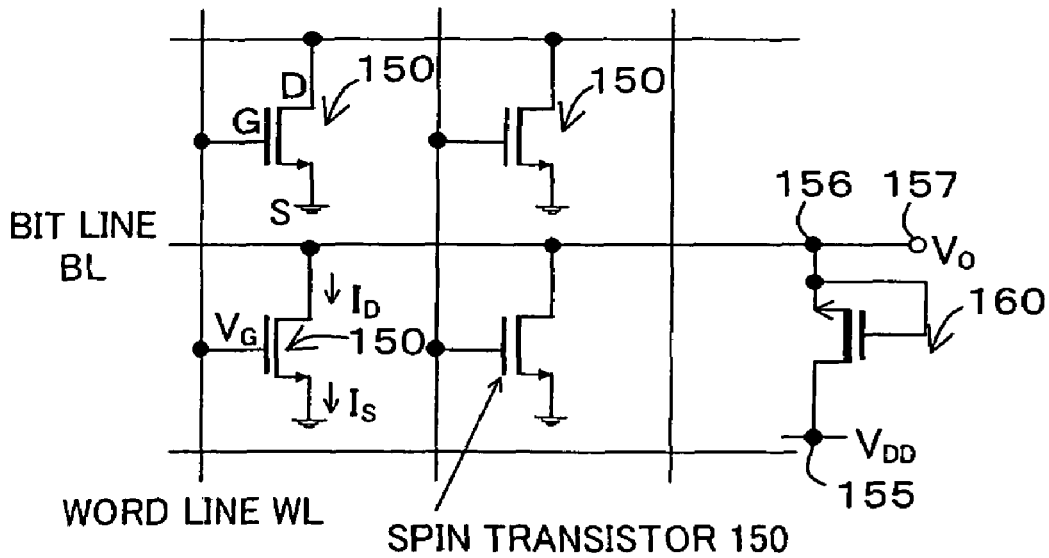
Figure 6:
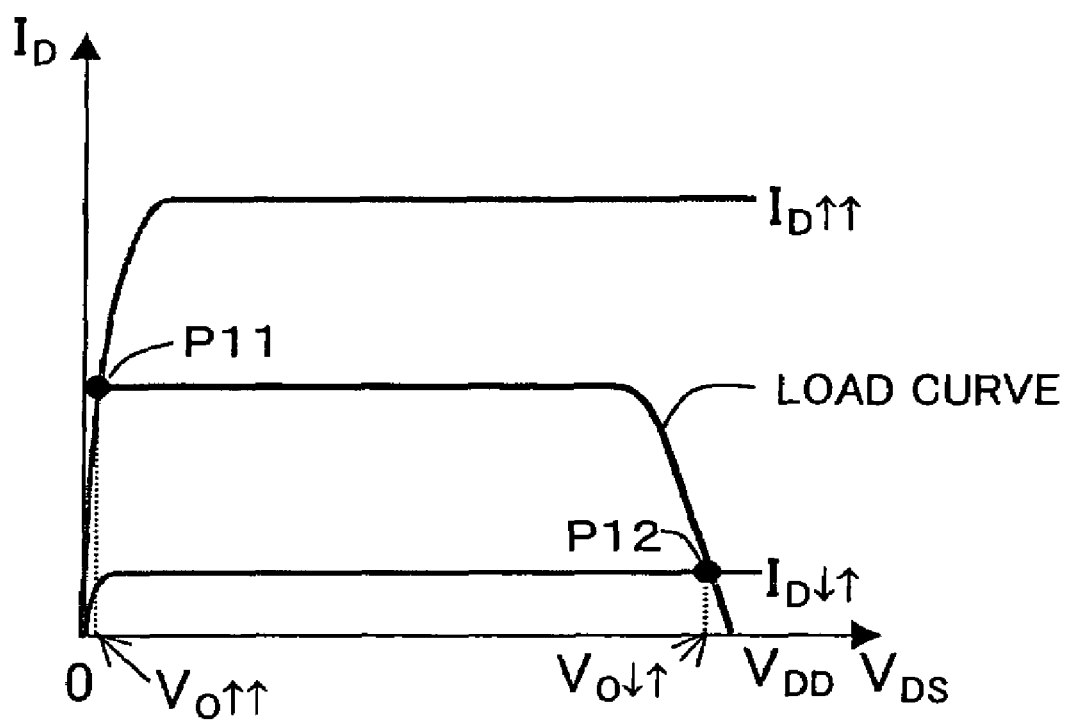

FIG. 6 (A) shows an example of the memory cell using the spin transistor. FIG. 6 (B) shows an example of a memory circuit configured with the memory cell. The relationship between FIG. 6 (A) and FIG. 6 (B) is the same as that between FIG. 4 (A) and FIG. 4 (B). In the memory circuit shown in FIG. 6 (A), a number of spin transistors 150 are arranged in a matrix, with the sources S grounded and the drains D and the gates G connected to a bitline BL for sensing and a wordline WL for sensing, respectively. A wordline for writing and a bitline for writing are arranged to intersect one another above the spin transistors 150 in a manner electrically insulated from other wires. The wordline for writing and the bitline for writing may be combined with the aforementioned bitline BL for sensing and the wordline WL for sensing, as shown in FIGS. 6 (A) and (B). In the case of FIGS. 6 (A) and (B), a memory cell can be configured with a single spin transistor, and also a very simple wiring arrangement can be adopted.

Particularly in the case of a voltage-driven spin transistor, which has a similar form to that of a MOS transistor, a layout suitable for microfabrication can be easily obtained by, for example, causing adjacent memory cells to use the source in common.

The aforementioned writing/sensing bitlines and writing/sensing wordlines will be hereafter referred to simply as a bitline BL and a wordline WL, respectively.

Information can be written over by causing a current to flow through the bitline BL and the wordline WL that intersect over a selected memory cell and then inverting the free layer of the selected memory cell with a composed magnetic field induced by the current through the respective lines. In order not to allow non-selected cells connected to the same bitline BL or wordline WL as those of the selected cell to be inverted by magnetization, a current value that is caused to flow in each line is set in advance such that no magnetization inversion is caused by a magnetic field emitted by one of the lines.

When sensing information, a voltage is applied to the wordline WL of a selected cell so as to cause the spin transistor to conduct, and then a voltage is applied to the bitline BL to detect the magnitude of the drain current. Based on the magnitude of the drain current, the relative magnetization configuration of the free layer and the pin layer can be detected.

FIG. 6 (B) shows the memory circuit shown in FIG. 6 (A), to a bitline end of which an output terminal $V_O$ is connected, with a branch from the output terminal $V_O$ connected to a power supply voltage $V_{DD}$ via a load. FIG. 6 (C) shows the static characteristics and operating points of the memory cell shown in FIG. 6 (B). Although an active load 160 consisting of a depletion-type MOS transistor is used as the load in this example, pure resistance may be used, as shown in FIG. 4 (B). Referring to FIG. 6 (C), when sensing information, a gate voltage $V_{GS}$ is applied to the gate of a spin transistor 150 and a power supply voltage $V_{DD}$ is applied to the bitline BL via a load. This causes the operating point due to the active load to move along the load curve shown in FIG. 6 (C) (between P11 and P12) depending on the magnetization configuration between the pin layer and the free layer. As a result, the output signal $V_O$ would be $V_{O\uparrow\uparrow}$ or $V_{O\downarrow\uparrow}$ for the parallel or antiparallel magnetization, respectively. The absolute values of the output signals and their ratio ($V_{O\uparrow\uparrow}/V_{O\downarrow\uparrow}$) can be optimized using the transistor characteristics of the active load or the parameters of peripheral circuitry, such as $V_{DD}$. For example, by optimizing the intersection of the static characteristics of the spin transistor and the load curve of the active load, a large output signal ratio can be obtained even when the drain current ratio $I_{O\uparrow\uparrow}/I_{O\downarrow\uparrow}$ is small. Further, even if there are variations in the values of $I_{O\uparrow\uparrow}$ and $I_{O\downarrow\uparrow}$ among memory cells, the fluctuation in the output voltage can be almost eliminated as long as the saturation current of the active load is larger than $I_{O\downarrow\uparrow}$ and smaller than $I_{C\uparrow\uparrow}$. Because no sense amplifiers are used for sensing information, a high-speed sensing can be performed. Thus, the memory circuit of the present embodiment is advantageous in that output signals of a desired magnitude can be easily obtained and in that a high-speed sensing can be performed.

In the conventional memory cell utilizing the MTJ and MOS transistors, output voltages produced by the resistance of a MTJ are sensed by a sense amplifier. In this case, however, because the output voltage is determined by the value of the current through the MTJ and the impedance of the MTJ (junction resistance), the output voltage ratio cannot be freely adjusted by peripheral circuitry.

In the following, the structure of a spin transistor that can be used in the nonvolatile memory circuit of the present embodiment will be described with reference to the drawings, using abbreviations FM for ferromagnetic metal, FS for electrically conductive ferromagnetic semiconductor, IFS for insulating ferromagnetic semiconductor, and NM for a nonmagnetic material. In particular, an "NM metal" designates a nonmagnetic metal, and an "NM semiconductor" designates a nonmagnetic semiconductor. First, a group of spin transistors of the current-driven type will be described.

Figure 7:
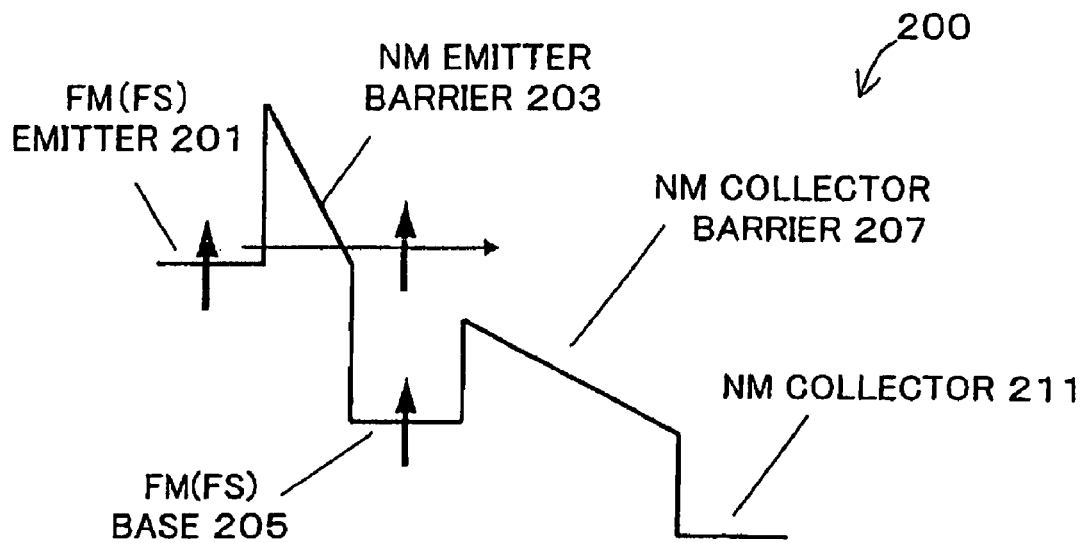
FIG. 7 shows an energy band diagram of an example of a hot-electron transistor type spin transistor.

FIG. 7 shows an energy band diagram of a hot-electron transistor type spin transistor. A spin transistor 200 comprises an emitter 201 and a base 205 that are formed by FM or FS. Specifically, the spin transistor 200 comprises emitter 201 formed by FM (or FS); emitter barrier 203 formed by NM; base 205 formed by FM (or FS); collector barrier 207 formed by NM; and collector 211 formed by NM. NM may be either a nonmagnetic metal or a nonmagnetic semiconductor.

In the spin transistor 200 shown in FIG. 7, spin-polarized hot carriers are tunnel-injected from the emitter 201 to the base 205 via the emitter barrier 203. When the emitter 201 and the base 205 possess parallel magnetization, the injected spin-polarized hot carriers hardly experience spin-dependent scattering within the base 205. Thus, by setting the base width such that the carriers can pass through the base 205 ballistically, the carriers can be transported beyond the collector barrier 207 to the collector 211. This is a transistor operation similar to that of a conventional hot electron transistor.

On the other hand, when the emitter 201 and the base 205 possess antiparallel magnetization, the spin-polarized hot carriers injected from the emitter 201 to the base 205 lose energy due to the spin-dependent scattering within the base 205 and are therefore unable to overcome the collector barrier 207, resulting in a base current. Namely, when the emitter 201 and the base 205 possess antiparallel magnetization, the current transfer ratio drops as compared with the case of parallel magnetization. Therefore, even if the same bias is applied to the spin transistor 200, the current transfer ratio or current gain varies depending on the difference in the relative magnetization configuration between the emitter 201 and the base 205. The spin transistor 200 can be operated at room temperature by appropriately selecting the collector barrier height, for example.

In the spin transistor 200, if the ratio of the current transfer ratio in the case where the emitter-base junction has parallel magnetization and that in the case where the junction has antiparallel magnetization is to be increased, the base width must be sufficiently large so that the spin-dependent scattering can effectively function. However, when the base width is increased, the current transfer ratio becomes smaller even when the emitter-base junction has parallel magnetization, dropping below 0.5, for example. Thus, there is a tradeoff between an increase in the base width and a decrease in amplification function.

Figure 8:
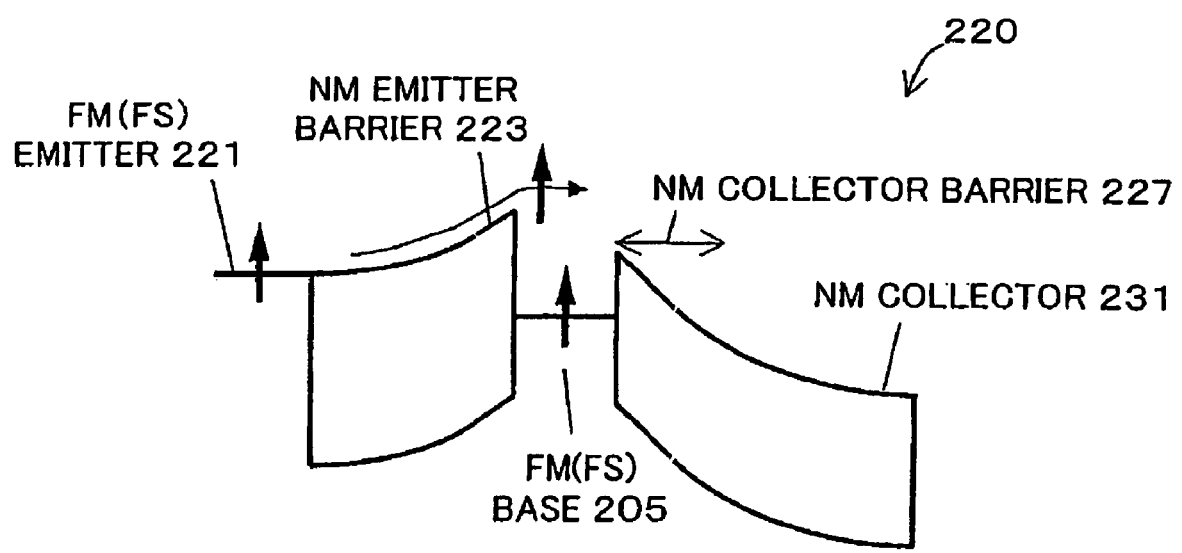
FIG. 8 shows an energy band diagram of an example of a hot-electron transistor type spin transistor employing thermionic emission injection.

FIG. 8 shows an energy band diagram of a hot-electron transistor type spin transistor in which thermionic emission is utilized as a mechanism for injecting spin polarized carriers to the base. As shown in FIG. 8, a spin transistor 220 comprises an emitter 221 formed by FM (or FS); a base 225 formed by FM (or FS); and an emitter barrier 223 disposed between the emitter and the base and formed by NM. Furthermore, on the opposite side to the junction between the base 225 and the emitter barrier 223, there is provided a collector barrier 227 formed by NM and a collector 231 formed by NM. The emitter barrier 223 and collector barrier 227 may be formed by a nonmagnetic semiconductor. The collector 231 may be formed by a nonmagnetic semiconductor or a nonmagnetic metal.

Figure 9:
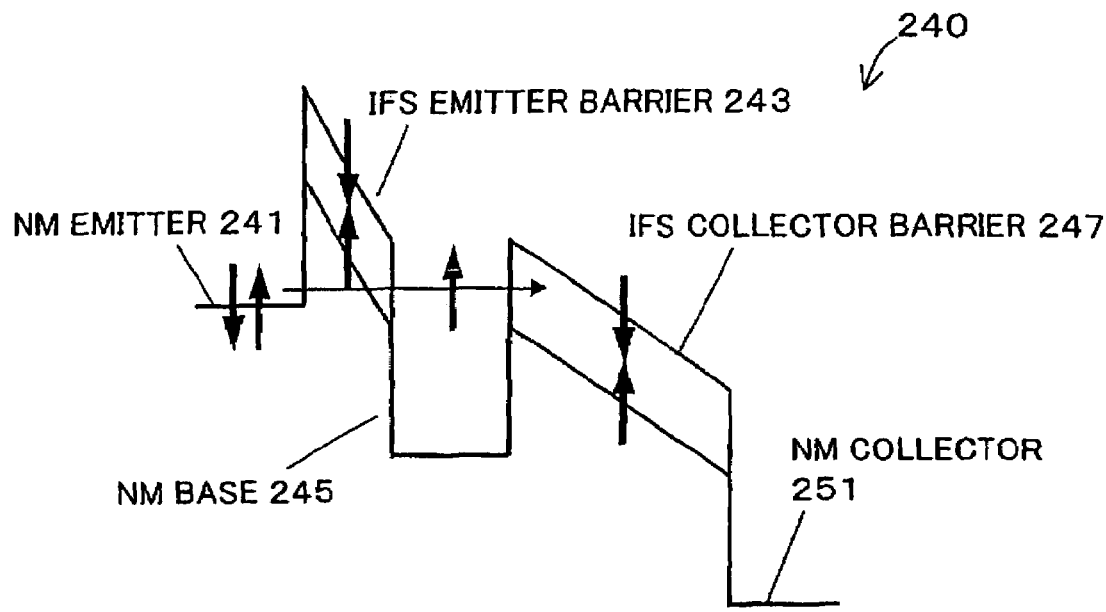
FIG. 9 shows an energy band diagram of an example of a hot-electron transistor type spin transistor utilizing the spin-filter effect.

Between the emitter 221 and the emitter barrier 223, an ohmic contact or a tunnel contact is formed. Between the base 225 and the emitter barrier 223, and between the base 225 and the collector barrier 227, a junction exhibiting a band discontinuity as shown in FIG. 9 is formed. This band discontinuity can be realized by a Schottky junction between NM semiconductor and FM, or by a heterojunction between NM semiconductor and FS. Alternatively, a Schottky junction may be formed between FS and FM, and the resultant Schottky-barrier may be used as the emitter barrier, with FS and FM functioning as emitter and base, respectively.

The spin-polarized carriers diffused from the emitter 221 to the emitter barrier 223 through the application of a bias to the base 225 with respect to the emitter 221 are injected to the base 225 as hot carriers by thermionic emission. When the emitter 221 and the base 225 possess parallel magnetization, the spin-polarized hot carriers injected into the base 225 can reach the collector without being subjected to spin-dependent scattering. However, when the emitter 221 and the base 225 possess antiparallel magnetization, the spin-polarized hot carriers are rendered into a base current by spin-dependent scattering. In this transistor 220 too, because it utilizes spin-dependent scattering in the base, there is a tradeoff, as in the above-described spin transistor 200, between the ratio of the current transfer ratio in the case of parallel magnetization and that in the case of antiparallel magnetization, and the current transfer ratio in the case of parallel magnetization. The transistor 220, however, is advantageous as compared with the spin transistor 200, which utilizes tunnel injection, in that a larger current driving force can be obtained and in that a room temperature operation can be easily realized.

FIG. 9 shows an energy band diagram of a hot-electron transistor type spin transistor utilizing the spin-filter effect. Although the transistor has already been described in detail, its characteristics will be briefly described. A spin transistor 240 shown in FIG. 9 comprises an emitter barrier 243 and a collector barrier 247 that are formed by IFS. Via an emitter 241, which is formed by an NM semiconductor (or an NM metal), the carriers with one spin can be selectively injected into the base 245, which is formed by an NM semiconductor (or an NM metal), through the spin-filter effect provided by the emitter barrier 243. When the base width is set to be not greater than the mean free path of the spin-polarized hot carriers, the spin-polarized hot carriers injected into the base 245 are transported to the base 245 ballistically. In this case, the spin transistor 240 is biased such that the spin-polarized hot carriers are injected into the energy-split width between an up-spin band (a spin band edge designated by the upward arrow in FIG. 9) and a down-spin band (a spin band edge designated by the downward arrow in FIG. 9). When the emitter barrier 243 and the collector barrier 247 have parallel magnetization, the spin-polarized hot carriers injected into the base 245 can overcome the barrier of the spin band of lower energy in the collector barrier 247 through the spin-filter effect of the collector barrier 247, and therefore propagate to a collector 251, which is formed by an NM semiconductor (or an NM metal). On the other hand, when the emitter barrier 243 and the collector barrier 247 have antiparallel magnetization, most of the spin-polarized hot carriers cannot overcome the collector barrier 247 because of the spin-filter effect of the collector barrier 247, resulting in a base current.

Thus, in the spin transistor 240, the current transfer ratio (or the current gain) differs depending on the relative magnetization configuration of the emitter barrier 243 and the collector barrier 247. Because the spin-filter effect provides a very high spin-selectivity, the ratio of current transfer ratio in the case of parallel magnetization and that in the case of antiparallel magnetization can be increased.

Furthermore, in the spin transistor 240, the base width can be made sufficiently small. Therefore, in contrast to the spin transistor that utilizes spin-dependent scattering, as in the cases shown in FIGS. 7 and 8, the spin transistor 240 is advantageous in that there is no tradeoff between the current gain relating to the base width and the spin selectivity.

Figure 10:
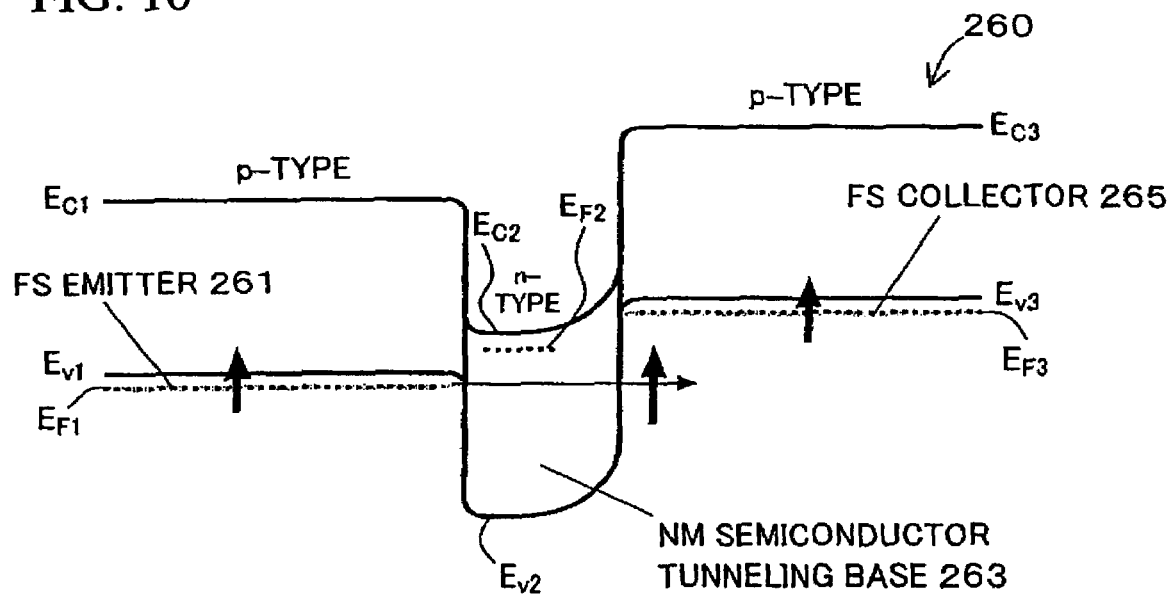
FIG. 10 shows an energy band diagram of an example of a tunnel base transistor type spin transistor.

FIG. 10 shows an energy band diagram of a tunnel base transistor type spin transistor. As shown in FIG. 10, a tunnel base transistor type spin transistor 260 comprises an emitter 261 and a collector 265 that are formed by a p-type (or an n-type) FS, and a tunnel base 263, which is formed by an n-type (or a p-type) NM semiconductor. In the emitter-base junction and in the base-collector junction, a heterojunction of type II is preferably used so that the base 263 becomes a barrier to the holes (or electrons). The base width is reduced sufficiently that a tunneling current from the emitter to the collector is produced.

In the structure shown in FIG. 10, when the emitter 261 and the collector 265 have parallel magnetization, the carriers with the majority spin in the emitter can be easily transported to the collector 265 through tunneling, namely, the tunnel conductance is large. However, when the emitter 261 and the collector 265 have antiparallel magnetization, the tunnel conductance is reduced by the tunneling magnetoresistance (TMR) effect. Thus, the magnitude of the collector current can be controlled by the relative magnetization configuration between the emitter 261 and the collector 265.

If the TMR ratio in the spin transistor 260 can be increased, the change in collector current that depends on the magnetization configuration between emitter and collector can be increased. In order to allow the TMR effect to be effectively exhibited in the spin transistor 260, it is preferable to prevent the depletion layer from expanding towards the collector when a reverse bias is applied across the base-collector junction. It is noted, however, that if the depletion layer is expanded towards the base, a problem could possibly arise in the collector current saturation characteristics.

When the base layer in the spin transistor 260 is heavily doped so as to prevent the spreading of the depletion layer and to cause the depletion layer in the base-collector junction to spread towards the collector, the TMR effect in the base cannot be expected. However, the carriers injected into the collector are subjected to spin-dependent scattering in the collector resistance, resulting in increased resistance. By utilizing this spin-dependent scattering, the magnitude of the collector current can be varied by the magnetization configuration in the emitter-collector junction. It is possible, however, that the effect is not so large as that obtained with the TMR effect because the resistance change through spin-dependent scattering is small.

Hereafter, a group of voltage-driven spin transistors will be described with reference to the drawings.

Figure 11:
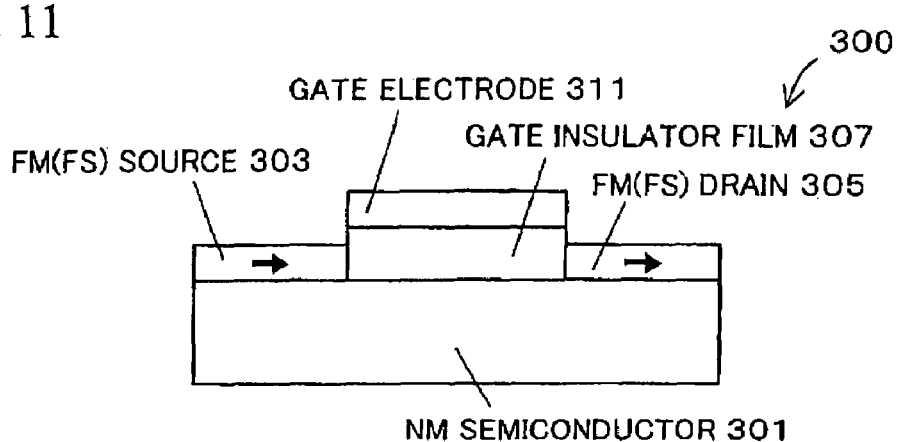
FIG. 11 shows a cross section of a MOS transistor type spin transistor.

FIG. 11 shows a cross-section of a MOS transistor type spin transistor. As shown in FIG. 11, the MOS transistor type spin transistor 300 comprises an NM semiconductor 301 on which a source 303 formed by FM, a drain 305 formed by FM, and a gate electrode 311 are formed, the gate electrode via a gate insulating film 307. A Schottky junction of FM and an NM semiconductor is used for the source 303 and the drain 305. The other structures are the same as those of a conventional MOS transistor.

Spin-polarized carriers injected from the source 303 into a channel formed directly below the gate insulating film 307 of the NM semiconductor 301 pass through the channel to the drain 305 (hereafter, the influence of the Rashba effect due to the gate electric field of the spins injected into the channel will be ignored for simplicity). When the source 303 and the drain 305 have parallel magnetization, the spin-polarized carriers injected into the drain 305 are not subject to spin-dependent scattering. When they have antiparallel magnetization, however, resistance by spin-dependent scattering is produced in the drain electrode 305.

Thus, in the transistor 300, the mutual conductance differs depending on the relative magnetization configuration between the source and drain.

The source 303 and the drain 305 may be formed by FS, and a pn junction is formed between each and the semiconductor 301.

Figure 12:
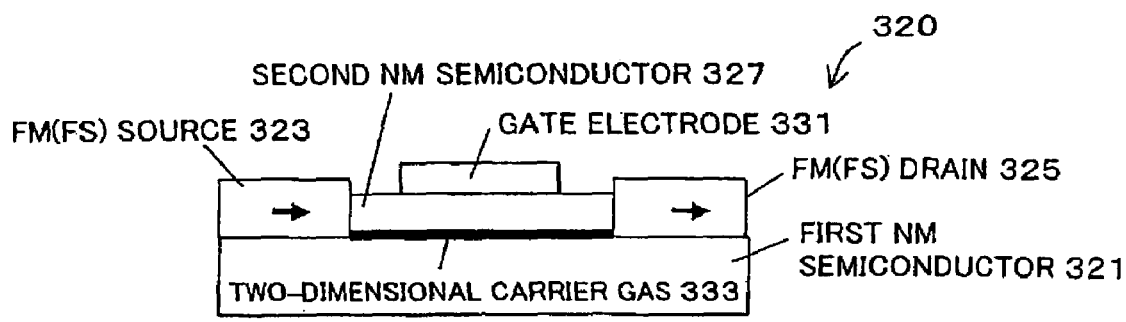
FIG. 12 shows a cross section of a modulation-doped transistor type spin transistor.

FIG. 12 shows a cross section of a modulation-doped transistor type spin transistor. The spin transistor 320 comprises a source 323 of FM (or FS) in contact with the two-dimensional carriers gas produced at the boundary between a first NM semiconductor 321 and a second NM semiconductor 327; a drain 325 formed by FM (or FS); and a gate electrode 331. The spin transistor 320 is identical to a conventional modulation-doped transistor with the exception that the source 323 and drain 325 are formed by a ferromagnet.

Spin-polarized carriers are injected from the source 323 to a channel 333 formed by the two-dimensional carrier gas. The spin-polarized carriers that reach the drain 325 have different mutual conductance depending on the relative magnetization configuration of the source 323 and the drain 325 due to spin-dependent scattering in the drain 325.

Figure 13:
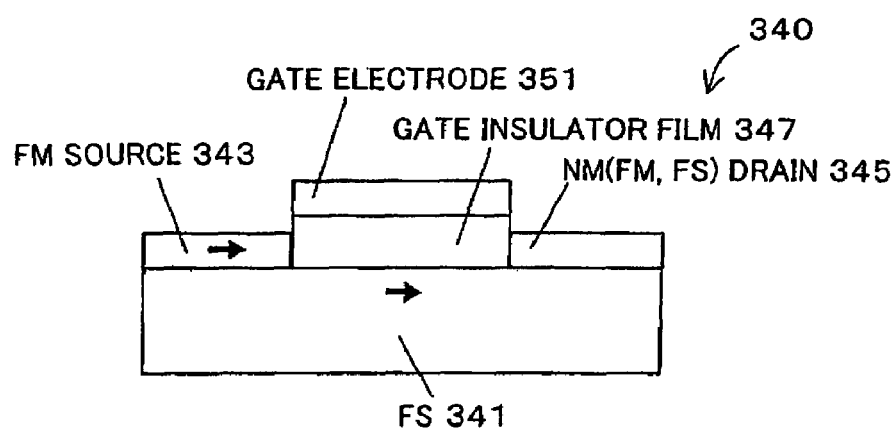
FIG. 13 shows a cross section of an example of a MOS transistor type spin transistor comprising a ferromagnetic semiconductor channel.

FIG. 13 shows a cross section of a MOS transistor type spin transistor in which the channel region is formed by FS. The spin transistor 340 shown in FIG. 13 comprises FS 341 on which a source 343 formed by FM, a drain 345 formed by NM (or FM or FS), and a gate electrode 351 via a gate insulating film 347 are formed. A Schottky junction of FM and FS is used in the source 343; except for that, the structure is identical to that of a conventional MOS transistor.

Spin-polarized carriers are injected from the source 343 into the channel 341 by tunneling through the Schottky barrier. Based on the TMR effect and the spin-dependent scattering in the channel of FS 341 during tunneling injection, a mutual conductance that depends on the relative magnetization configuration of the source 343 and FS 341 is realized.

Figure 14:
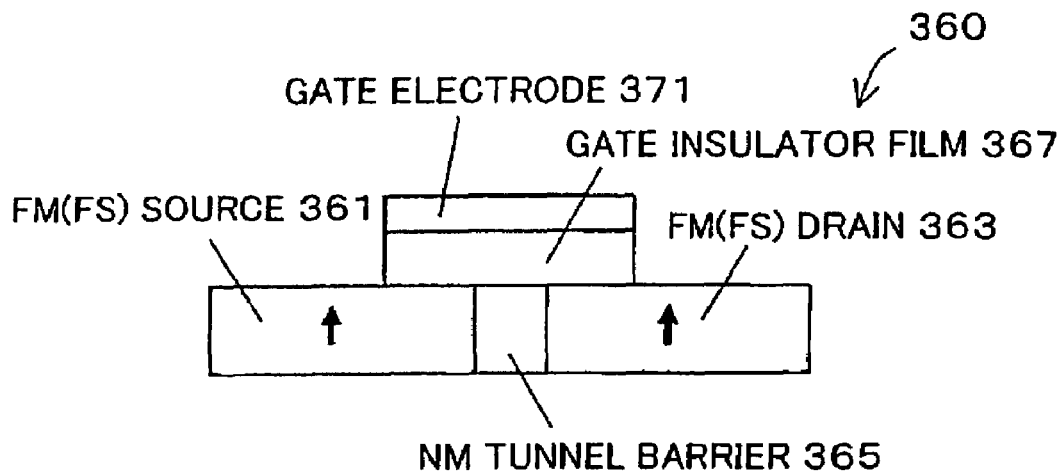
FIG. 14 shows a cross section of an example of a spin transistor comprising a ferromagnetic source, a ferromagnetic drain, and a nonmagnetic insulating tunnel barrier disposed between the source and the drain, wherein a gate insulating film and a gate electrode are formed on the tunnel barrier.

FIG. 14 shows a cross section of a spin transistor 360 comprising a tunnel junction structure in which an insulating NM tunnel barrier 365 is disposed between a source 361 formed by FM (or FS) and a drain 363 formed by FM (or FS). It is a spin transistor with the gate electrode 371 disposed such that an electric field can be applied to the tunnel barrier 365.

The thickness of the tunnel barrier 365 is preferably set such that no Fowler-Nordheim (FN) tunneling occurs when only a source-drain bias is applied. A triangular potential at the band edge of the tunnel barrier produced by applying a bias across the source-drain junction is varied by the gate voltage in order to induce FN tunneling and obtain a drain current.

Spin-polarized carriers injected from the source 361 are subject to spin-dependent scattering in the drain 363 depending on the relative magnetization configuration of the source 361 and drain 363. Thus, the mutual conductance of the transistor can be controlled by the relative magnetization configuration between the source and drain.

Figure 15:
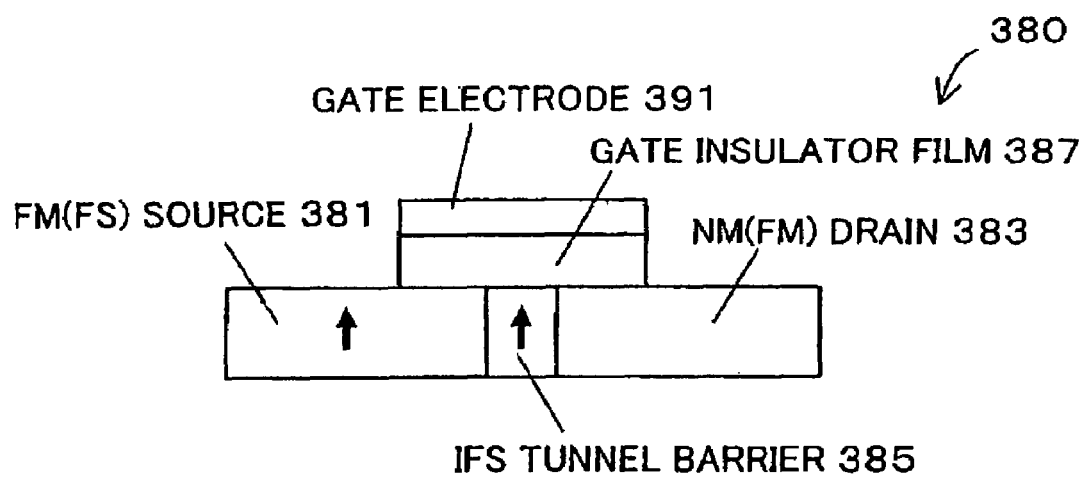
FIG. 15 shows a cross section of an example of a spin transistor comprising a ferromagnetic source, a ferromagnetic drain or a nonmagnetic drain, and an insulating ferromagnetic tunnel barrier disposed between the source and drain, wherein a gate insulating film and a gate electrode are formed on the tunnel barrier.

FIG. 15 shows a cross section of a spin transistor 380, which is similar to the spin transistor 360 shown in FIG. 14 with the exception that the tunnel barrier comprises a tunnel barrier 385 formed by IFS. While a source 381 must be FM or FS, a drain 383 may not be a ferromagnet. In the IFS tunnel barrier layer 385, the barrier height differs depending on the spin direction of the carriers. A bias is therefore applied between the source and drain and across the source-gate junction such that the transistor conducts when the source 381 and the tunnel barrier 385 have parallel magnetization. Under the same bias condition, when the source 381 and tunnel barrier 385 have antiparallel magnetization, the tunnel barrier height as seen from the majority spin in the source 381 increases. As a result, the tunneling probability of the spin-polarized carriers decreases, leading to a decrease in drain current. Because the spin selectivity provided by this spin-filter effect is extremely large, the change in mutual conductance depending on the relative magnetization configuration of the source and drain can be increased by using a ferromagnet with a large spin polarization in the source 381.

Any of the above-described various spin transistors may be used as the memory cells for the memory circuit shown in FIG. 4 or FIG. 6.

Figure 16:
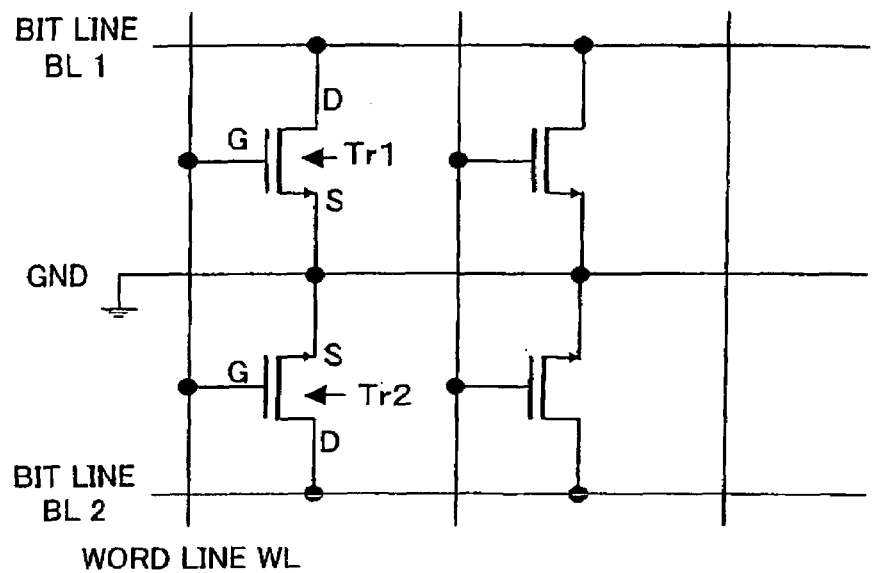
FIG. 16 (A) shows an example of a memory cell with a common-source configuration.
Figure 16:
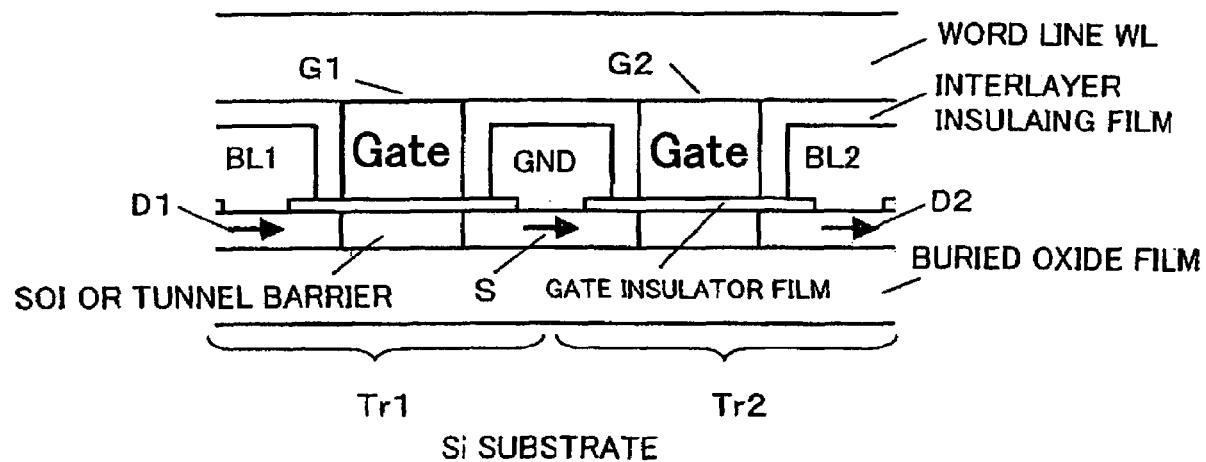
Figure 17:
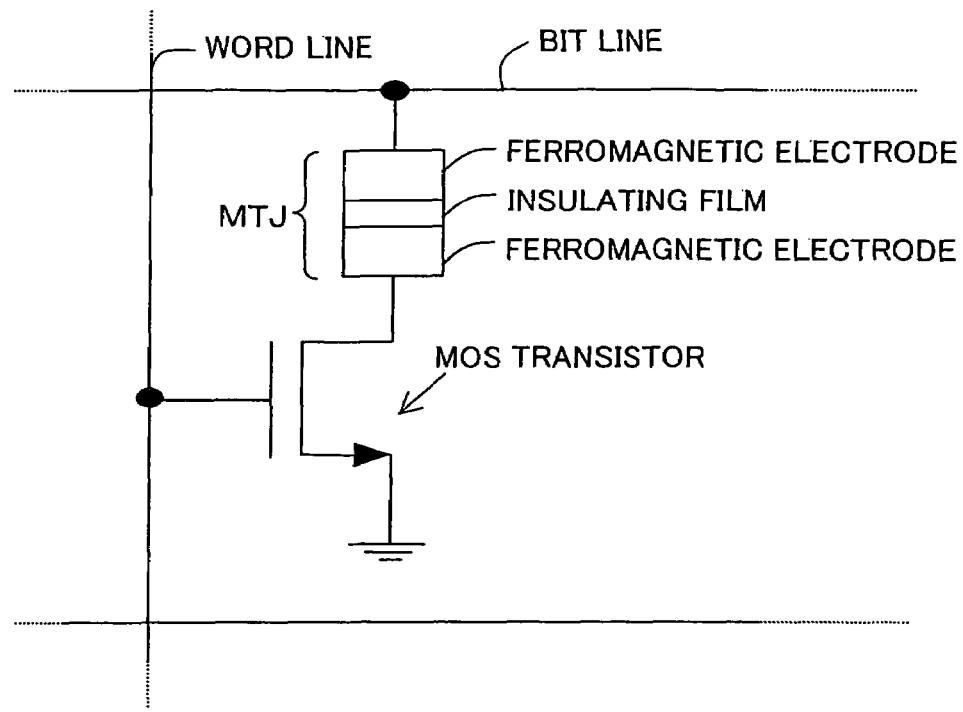
FIG. 17 (A) shows the structure of a conventional MRAM utilizing a MTJ.
Figure 17:
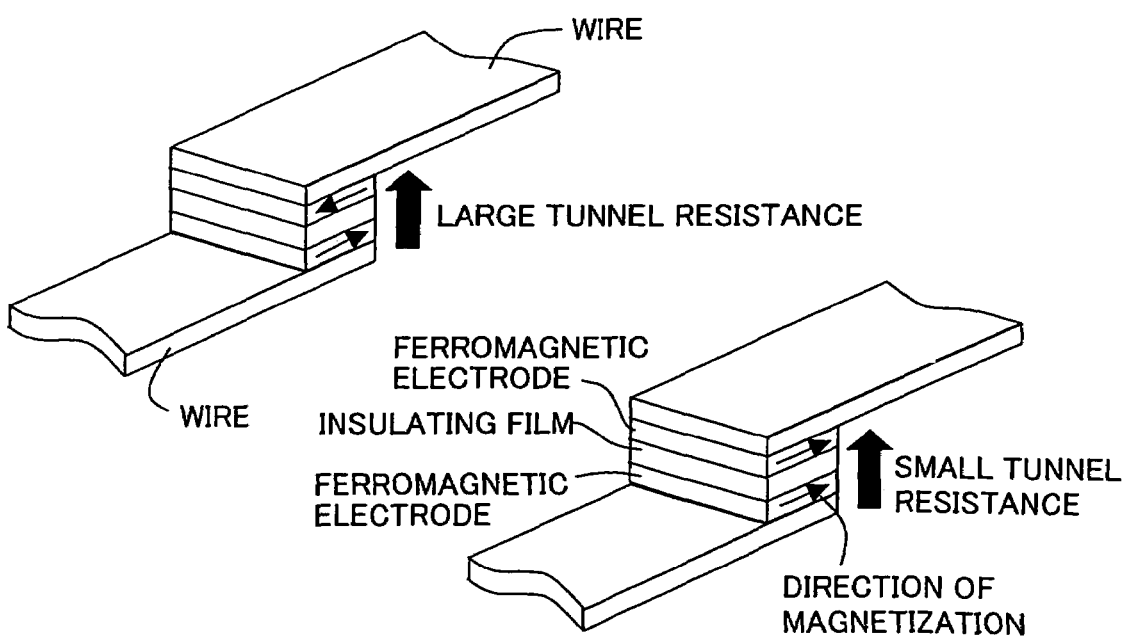

It is also possible to form a configuration in which the two voltage-driven spin transistors shown in FIGS. 11, 14, and 15 have a common source. FIG. 16 (A) shows an example of a memory cell of a common-source configuration. FIG. 16 (B) shows a cross section of the memory cell of a common-source configuration.

The memory cell structure shown in FIGS. 16 (A) and (B) comprises a first spin transistor Tr1 and a second spin transistor Tr2 that are disposed adjacent to one another; a word-line WL connecting a gate electrode G1 of the first spin transistor Tr1 and a gate electrode G2 of the second spin transistor Tr2; a first bitline BL1 connected to a first drain D1 of the first spin transistor Tr1; a second bitline BL2 connected to a second drain D2 of the second spin transistor; a ferromagnetic source S common to the first and second spin transistors Tr1 and Tr2; and a line connecting the common source to ground. In this configuration, the common source makes the cell structure suitable for higher-density integration.

In particular, the voltage-driven spin transistors shown in FIGS. 11, 14, and 15 preferably comprise a highly insulating substrate, such as an SOI substrate as shown in FIG. 16 (B), so as to reduce leakage current when the transistor is off.

As described above, the spin-filter transistor and various spin transistors according to the various embodiments of the present embodiment are characterized in that the output characteristics can be controlled by the relative magnetization configuration of the pin layer and free layer within the device. The relative magnetization configuration is nonvolatile, namely, the device does not require the feeding of power for retaining the magnetization configuration. Thus, the device can store binary information in terms of the relative magnetization configuration in a nonvolatile fashion. Further, using the aforementioned output characteristics, the relative magnetization configuration can be electrically detected. Thus, a 1-bit nonvolatile memory cell can be configured with a single spin transistor. Using a nonvolatile memory circuit comprising a spin transistor according to the embodiments of the invention, the ratio of output signals as well as their magnitudes with respect to the stored information can be freely designed.

Thus, using the spin transistor according to the embodiments of the invention and a memory circuit comprising the spin transistor, the operating speed and the level of integration of a nonvolatile memory circuit can be increased.

While the present invention has been described with reference to various embodiments thereof, the present invention is not limited by any of these embodiments. It should be obvious to those skilled in the art that various modifications, improvements or combinations can be made.

INDUSTRIAL APPLICABILITY

In accordance with the spin-filter transistor of the present invention, the output characteristics can be greatly changed by the relative magnetization configuration of the ferromagnetic barrier layers.

A nonvolatile memory circuit comprising a memory cell employing this spin-filter transistor or a spin transistor with equivalent characteristics can store binary information in terms of the relative magnetization configuration of ferromagnets contained in the transistor. The relative magnetization configuration can also be detected electrically. Furthermore, using the nonvolatile memory circuit of the present invention, the output signals with respect to the stored information can be freely designed. Using such a spin transistor, a high-speed and high integration-density nonvolatile memory circuit can be realized that comprises a 1-bit nonvolatile memory cell made up of a single transistor.

The invention claimed is:

1. A transistor, comprising:
   a spin injector for injecting spin-polarized hot carriers by a spin-filter effect, the spin injector including an emitter;
   a spin analyzer for selecting the thus injected spin-polarized hot carriers by the spin-filter effect, the spin analyzer including a collector; and
   a second nonmagnetic electrode layer having a thickness such that the carriers injected from the spin injector pass through said second nonmagnetic electrode layer as hot carriers, one end surface of said second nonmagnetic electrode layer being joined to one end surface of said spin injector, and the other end surface of said second nonmagnetic electrode layer being joined to one end surface of said spin analyzer,
   wherein said spin injector comprises:
      a first ferromagnetic barrier layer having a thickness that allows the carriers to be transported by tunneling upon application of a voltage across said first ferromagnetic barrier layer and having a band edge that is higher than a band edge of said second nonmagnetic electrode layer, one end surface of said first ferromagnetic barrier layer being joined to said one end surface of said second nonmagnetic electrode layer; and
      a first nonmagnetic electrode layer joined to the other end surface of said first ferromagnetic barrier layer.

2. The transistor according to claim 1, wherein said spin analyzer comprises:
   a second ferromagnetic barrier layer, one end of second ferromagnetic barrier layer being joined to said the other end surface of said second nonmagnetic electrode layer; and;
   a third nonmagnetic electrode layer joined to the other end surface of said second ferromagnetic barrier layer.

3. The transistor according to claim 2, wherein said first and second ferromagnetic barrier layers comprise a ferromagnetic semiconductor or a ferromagnetic insulator.

4. The transistor according to claim 1, wherein the thickness of said second nonmagnetic electrode layer is smaller than the mean free path of the spin-polarized hot carriers in said second nonmagnetic electrode layer.

5. The transistor according to claim 1, wherein the spin-filter effect of said spin injector takes advantage of the fact that, in a carrier tunneling effect in said first ferromagnetic barrier layer which is produced through the application of a voltage to said first nonmagnetic electrode layer and to said second nonmagnetic electrode layer, those of the carriers that exist in said first nonmagnetic electrode layer and that have a spin direction parallel to a spin band at the band edge of said first ferromagnetic barrier layer have a large tunneling probability, while those carriers with an antiparallel spin direction have a small tunneling probability.

6. The transistor according to claim 1, wherein the spin-filter effect of said spin analyzer takes advantage of the fact that, when the spin direction of the spin-polarized hot carriers injected from said spin injector is parallel to that of the spin band at the band edge of said second ferromagnetic barrier layer, said spin-polarized hot carriers are transported through the spin band at the band edge of said second ferromagnetic barrier layer and reach said third nonmagnetic electrode layer, whereas when the spin direction of said spin-polarized hot carriers is antiparallel to that of the spin band at the band edge of said second ferromagnetic barrier layer, said spin-polarized hot carriers are unable to reach said third nonmagnetic electrode layer.

7. The transistor according to claim 1, wherein a first voltage is applied between said first nonmagnetic electrode layer and said second nonmagnetic electrode layer from a first power supply, and a second voltage is applied between said second nonmagnetic electrode layer and said third nonmagnetic electrode layer or between said first nonmagnetic electrode layer and said third nonmagnetic electrode layer, from a second power supply, and wherein said spin-polarized hot carriers injected from said first nonmagnetic electrode layer to said second nonmagnetic electrode layer are switched to a current through said second ferromagnetic barrier layer and said second power supply or a current through said second nonmagnetic electrode layer and said first power supply depending on the relative magnetization configuration of said first ferromagnetic barrier layer and said second ferromagnetic barrier layer.

8. The transistor according to claim 7, wherein said first voltage is applied such that the energy of the injected spin-polarized hot carriers becomes larger than the spin band edge energy at the band edge of the said second ferromagnetic barrier layer and smaller than the energy of the spin band edge to which the spin-split width is added.

9. The transistor according to claim 8, wherein the relative magnetization configuration in said first ferromagnetic barrier layer or said second ferromagnetic barrier layer can be reversed with the application of a magnetic field.

10. A memory circuit comprising a memory cell formed by a transistor including
a spin injector for injecting spin-polarized hot carriers by a spin-filter effect, the spin injector including an emitter;
a spin analyzer for selecting the thus injected spin-polarized hot carriers by the spin-filter effect, the spin analyzer including a collector; and
and
a second nonmagnetic electrode layer having a thickness such that the carriers injected from the spin injector pass through said second nonmagnetic electrode layer as hot carriers, one end surface of said second nonmagnetic electrode layer being joined to one end surface of said spin injector, and the other end surface of said second nonmagnetic electrode layer being joined to one end surface of said spin analyzer.
wherein said spin injector comprises:
a first ferromagnetic barrier layer having a thickness that allows the carriers to be transported by tunneling upon application of a voltage across said first ferromagnetic barrier layer and having a band edge that is higher than a band edge of said second nonmagnetic electrode layer, one end surface of said first ferromagnetic barrier layer being joined to said one end surface of said second nonmagnetic electrode layer; and
a first nonmagnetic electrode layer joined to the other end surface of said first ferromagnetic baffler layer.

11. The memory circuit according to claim 10, wherein said spin analyzer comprises:
a second ferromagnetic barrier layer, one end of said second ferromagnetic barrier layer being joined to said the other end surface of said second nonmagnetic electrode layer;
and
a third nonmagnetic electrode layer joined to the other end surface of said second ferromagnetic barrier layer.

12. The memory circuit according to claim 11, wherein said second nonmagnetic electrode layer of said transistor is connected to a wordline, said third nonmagnetic electrode layer of said transistor is connected to a bitline, said bitline is connected to a power supply via a load, and said first nonmagnetic electrode layer of said transistor is connected to ground.

13. The memory circuit according to claim 11, wherein said first and second ferromagnetic barrier layers comprise a ferromagnetic semiconductor or a ferromagnetic insulator.

14. The memory circuit according to claim 10, wherein the thickness of said second nonmagnetic electrode layer is smaller than the mean free path of the spin-polarized hot carriers in said second nonmagnetic electrode layer.

15. The memory circuit according to claim 10, wherein the spin-filter effect of said spin injector takes advantage of the fact that, in a carrier tunneling effect in said first ferromagnetic barrier layer which is produced through the application of a voltage to said first nonmagnetic electrode layer and to said second nonmagnetic electrode layer, those of the carriers that exist in said first nonmagnetic electrode layer and that have a spin direction parallel to a spin band at the band edge of said first ferromagnetic barrier layer have a large tunneling probability, while those carriers with an antiparallel spin direction have a small tunneling probability.

16. The memory circuit according to claim 10, wherein the spin-filter effect of said spin analyzer takes advantage of the fact that, when the spin direction of the spin-polarized hot carriers injected from said spin injector is parallel to that of the spin band at the band edge of said second ferromagnetic barrier layer, said spin-polarized hot carriers are transported through the spin band at the band edge of said second ferromagnetic barrier layer and reach said third nonmagnetic electrode layer, whereas when the spin direction of said spin-polarized hot carriers is antiparallel to that of the spin band at the band edge of said second ferromagnetic barrier layer, said spin-polarized hot carriers are unable to reach said third nonmagnetic electrode layer.

17. The memory circuit according to claim 10, wherein a first voltage is applied between said first nonmagnetic electrode layer and said second nonmagnetic electrode layer from a first power supply, and a second voltage is applied between said second nonmagnetic electrode layer and said third nonmagnetic electrode layer or between said first nonmagnetic electrode layer and said third nonmagnetic electrode layer, from a second power supply, and wherein said spin-polarized hot carriers injected from said first nonmagnetic electrode layer to said second nonmagnetic electrode layer are switched to a current through said second ferromagnetic barrier layer and said second power supply or a current through said second nonmagnetic electrode layer and said first power supply depending on the relative magnetization configuration of said first ferromagnetic barrier layer and said second ferromagnetic barrier layer.

18. The memory circuit according to claim 17, wherein said first voltage is applied such that the energy of the injected spin-polarized hot carriers becomes larger than the spin band edge energy at the band edge of the said second ferromagnetic barrier layer and smaller than the energy of the spin band edge to which the spin-split width is added.

19. The memory circuit according to claim 18, wherein the relative magnetization configuration in said first ferromagnetic barrier layer or said second ferromagnetic barrier layer can be reversed with the application of a magnetic field.

* * * * *